(12) United States Patent
Eki

(10) Patent No.: US 10,795,024 B2
(45) Date of Patent: Oct. 6, 2020

(54) IMAGING DEVICE AND ELECTRONIC DEVICE

(71) Applicant: SONY SEMICONDUCTOR SOLUTIONS CORPORATION, Kanagawa (JP)

(72) Inventor: Ryoji Eki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/330,468

(22) PCT Filed: Sep. 1, 2017

(86) PCT No.: PCT/JP2017/031539
§ 371 (c)(1),
(2) Date: Mar. 5, 2019

(87) PCT Pub. No.: WO2018/051809
PCT Pub. Date: Mar. 22, 2018

(65) Prior Publication Data
US 2019/0204448 A1  Jul. 4, 2019

(30) Foreign Application Priority Data

Sep. 16, 2016 (JP) .................................. 2016-181194

(51) Int. Cl.
*G01S 17/89* (2020.01)
*G01C 3/06* (2006.01)
(Continued)

(52) U.S. Cl.
CPC ................ *G01S 17/89* (2013.01); *G01C 3/06* (2013.01); *G01S 17/93* (2013.01); *H01L 27/146* (2013.01);
(Continued)

(58) Field of Classification Search
CPC ........ G01S 17/89; G01S 17/894; G01S 17/93; H04N 5/379; H04N 5/23218; H04N 5/225;
(Continued)

(56) References Cited

U.S. PATENT DOCUMENTS 6,617,565 B2   9/2003  Wu
2003/0184661 A1  10/2003  Yubata et al.
(Continued)

FOREIGN PATENT DOCUMENTS

JP   2003-283930   10/2003
JP   2006-067291   3/2006
(Continued)

OTHER PUBLICATIONS

Extended European Search Report for European Patent Application No. 17850712.5, dated Sep. 2, 2019, 9 pages.
(Continued)

*Primary Examiner* — Maria E Vazquez Colon
(74) *Attorney, Agent, or Firm* — Sheridan Ross P.C.

(57) ABSTRACT

The present technology relates to an imaging device and an electronic device that enable construction of an imaging device that outputs information required by a user with a small size. A single-chip imaging device includes: an imaging unit in which a plurality of pixels is arranged two-dimensionally and that captures an image; a signal processing unit that performs signal processing using a captured image output from the imaging unit; an output I/F that outputs a signal processing result of the signal processing and the captured image to an outside; and an output control unit that performs output control of selectively outputting the signal processing result of the signal processing and the captured image from the output I/F to the outside. The
(Continued)

present technology can be applied to, for example, an imaging device that captures an image.

21 Claims, 25 Drawing Sheets

(51) Int. Cl.
G01S 17/93 (2020.01)
H01L 27/146 (2006.01)
H04N 5/232 (2006.01)
H04N 5/225 (2006.01)
H04N 5/378 (2011.01)
H04N 5/369 (2011.01)
H04N 5/235 (2006.01)

(52) U.S. Cl.
CPC ......... H04N 5/225 (2013.01); H04N 5/23216 (2013.01); H04N 5/23218 (2018.08); H04N 5/23225 (2013.01); H04N 5/378 (2013.01); H04N 5/379 (2018.08); H04N 5/235 (2013.01)

(58) Field of Classification Search
CPC ........... H04N 5/23216; H04N 5/23225; H04N 5/378; H04N 5/235; G01C 3/06
See application file for complete search history.

(56) References Cited

U.S. PATENT DOCUMENTS

2009/0094570 A1 4/2009 Artyomov et al.
2009/0284633 A1* 11/2009 Sakane ................. H04N 5/335
                                                                       348/308
2011/0317006 A1* 12/2011 Kuboyama .......... G06K 9/0057
                                                                       348/140

FOREIGN PATENT DOCUMENTS

| JP | 2007-174160 | 7/2007 |
| JP | 2008-048313 | 2/2008 |
| JP | 2008-070120 | 3/2008 |
| JP | 2009-081808 | 4/2009 |
| JP | 2009081808 A * | 4/2009 |
| JP | 2009-145598 | 7/2009 |
| JP | 2010-283787 | 12/2010 |
| JP | 2011-023898 | 2/2011 |
| JP | 2011-508293 | 3/2011 |
| JP | 2014-082365 | 5/2014 |
| JP | 2014082365 A * | 5/2014 |
| JP | 2006-012062 | 1/2016 |
| JP | 2017-017624 | 1/2017 |

OTHER PUBLICATIONS

Official Action (no English translation available) for Japanese Patent Application No. 2018-539628, dated Oct. 1, 2019, 15 pages.
International Search Report prepared by the Japan Patent Office dated Sep. 20, 2017, for International Application No. PCT/JP2017/031539.

* cited by examiner

IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2017/031539 having an international filing date of 1 Sep. 2017, which designated the United States, which PCT application claimed the benefit of Japanese Patent Application No. 2016-181194 filed 16 Sep. 2016, the entire disclosures of each of which are incorporated herein by reference.

TECHNICAL FIELD

The present technology relates to an imaging device and an electronic device, and particularly to an imaging device and an electronic device that enable construction of an imaging device that outputs information required by a user with a small size, for example.

BACKGROUND ART

An imaging device in which chips such as a sensor chip, a memory chip, and a digital signal processor (DSP) chip are connected in parallel using a plurality of bumps has been proposed as an imaging device that captures an image (for example, see Patent Document 1).

CITATION LIST

Patent Document

Patent Document 1: Japanese Patent Application Laid-Open No. 2008-048313

SUMMARY OF THE INVENTION

Problems to be Solved by the Invention

In a case where chips are connected using bumps to construct an imaging device as in the imaging device described in Patent Document 1, the thickness of the imaging device increases and the size of the imaging device increases.

On the other hand, a user who uses an imaging device may require an image which is captured by the imaging device and may also require information (meta data) which is acquired from the image, not the image itself.

The present technology is made in consideration of the above-mentioned circumstances and an objective thereof is to enable construction of an imaging device that outputs information required by a user with a small size.

Solutions to Problems

An imaging device or an electronic device according to the present technology is a single-chip imaging device including: an imaging unit in which a plurality of pixels is arranged two-dimensionally and that captures an image; a signal processing unit that performs signal processing using a captured image output from the imaging unit; an output I/F that outputs a signal processing result of the signal processing and the captured image to the outside; and an output control unit that performs output control of selectively outputting the signal processing result of the signal processing and the captured image from the output I/F to the outside, or an electronic device including the imaging device.

In the imaging device and the electronic device according to the present technology, signal processing using a captured image which is output from the imaging unit in which a plurality of pixels is arranged two-dimensionally to capture an image is performed, and the signal processing result of the signal processing and the captured image are selectively output to the outside from the output I/F that outputs the signal processing result of the signal processing and the captured image to the outside.

The imaging device may be an independent device or may be an internal block constituting an independent device.

Effects of the Invention

According to the present technology, it is possible to enable construction of an imaging device that outputs information required by a user with a small size.

Incidentally, the effects described herein are not restrictive and any effect described in the present disclosure may be achieved.

MODE FOR CARRYING OUT THE INVENTION

<Embodiment of Digital Camera According to Present Technology>

Figure 1:
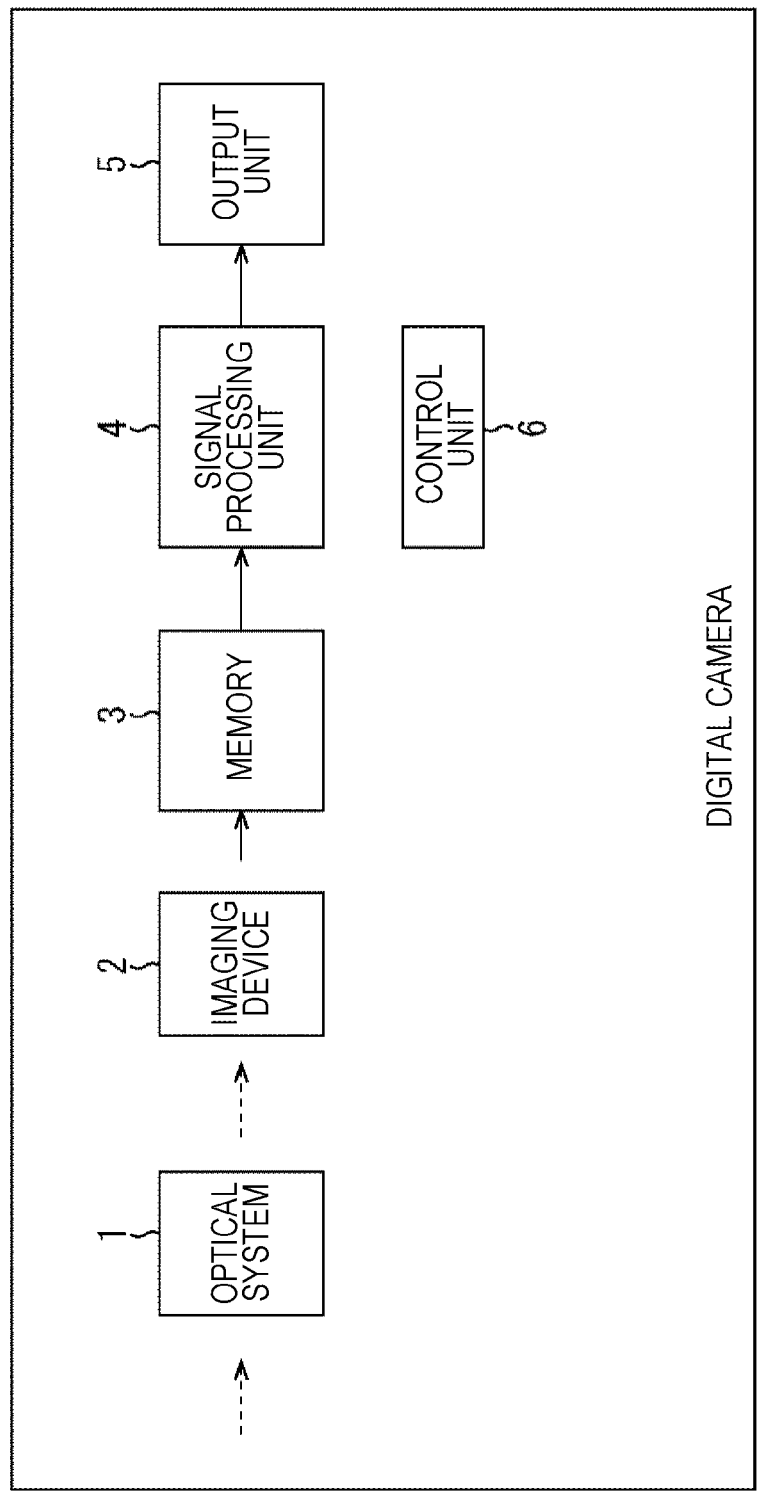
FIG. 1 is a block diagram illustrating an example of a configuration of an embodiment of a digital camera according to the present technology.

FIG. 1 is a block diagram illustrating an example of a configuration of an embodiment of a digital camera according to the present technology.

Incidentally, a digital camera can capture any of a still image and a moving image.

In FIG. 1, the digital camera includes an optical system 1, an imaging device 2, a memory 3, a signal processing unit 4, an output unit 5, and a control unit 6.

The optical system 1 includes, for example, a zoom lens, a focusing lens, an aperture stop, and the like, which are not illustrated and allows external light to be incident on the imaging device 2.

The imaging device 2 is, for example, a complementary metal oxide semiconductor (CMOS) image sensor constituted by a single chip and serves to receive incident light from the optical system 1, to perform photoelectric conversion, and to output image data corresponding to the incident light from the optical system 1.

Further, the imaging device 2 performs, for example, a recognition process of recognizing a predetermined recognition object and other signal processing using the image data or the like and outputs a signal processing result of the signal processing.

The memory 3 temporarily stores the image data or the like output from the imaging device 2.

The signal processing unit 4 performs processes such as noise removal and adjustment of white balance as camera signal processing using the image data stored in the memory 3 if necessary and outputs the process results to the output unit 5.

The output unit 5 outputs the image data from the signal processing unit 4 or the signal processing result stored in the memory 3.

That is, the output unit 5 includes, for example, a display (not illustrated) including liquid crystal or the like and displays an image corresponding to the image data from the signal processing unit 4 as a so-called through image.

Further, the output unit 5 includes, for example, a driver (not illustrated) that drives a recording medium such as a semiconductor memory, a magnetic disk, or an optical disc and records the image data from the signal processing unit 4 or the signal processing result stored in the memory 3 on the recording medium.

Furthermore, the output unit 5 functions, for example, as an interface (I/F) that performs data transfer to and from an external device and transmits the image data from the signal processing unit 4, the image data recorded on the recording medium, or the like to the external device.

The control unit 6 controls constituent blocks of the digital camera in response to a user's operation or the like.

In the digital camera having the above-mentioned configuration, the imaging device 2 captures an image. That is, the imaging device 2 receives incident light from the optical system 1, performs photoelectric conversion, acquires image data corresponding to the incident light, and outputs the image data.

The image data output from the imaging device 2 is supplied to the memory 3 and stored therein. The image data stored in the memory 3 is subjected to camera signal processing by the signal processing unit 4, and image data acquired as a result is supplied to the output unit 5 and output therefrom.

Further, the imaging device 2 performs signal processing using an image (data) and the like acquired by capturing an image and outputs a signal processing result of the signal processing. The signal processing result output from the imaging device 2 is stored, for example, in the memory 3.

In the imaging device 2, outputting of an image acquired by capturing an image and outputting a signal processing result of signal processing using the image or the like are selectively performed.

<Example of Configuration of Imaging Device 2>

Figure 2:
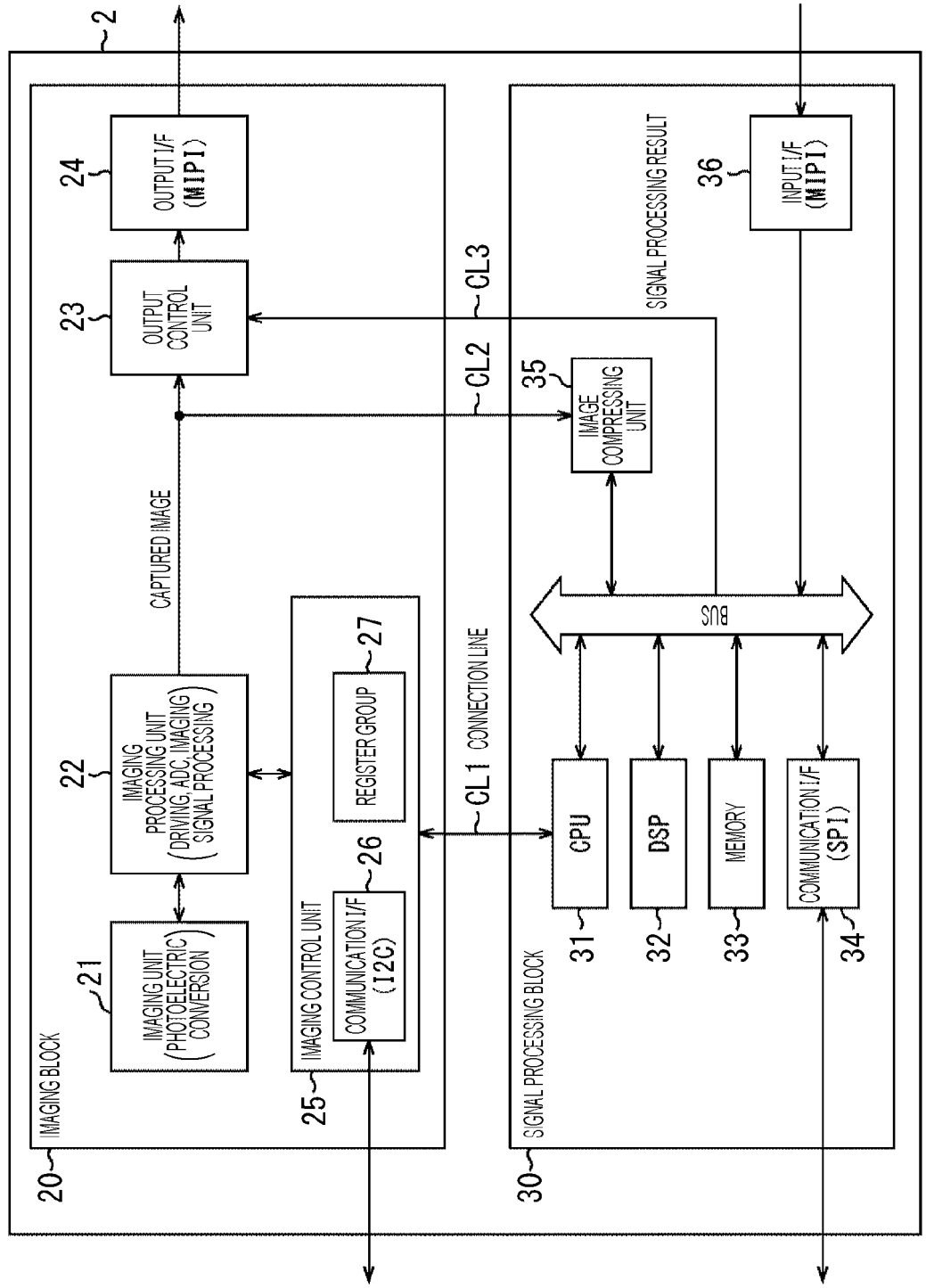
FIG. 2 is a block diagram illustrating an example of a configuration of an imaging device 2.

FIG. 2 is a block diagram illustrating an example of a configuration of the imaging device 2 illustrated in FIG. 1.

In FIG. 2, the imaging device 2 includes an imaging block 20 and a signal processing block 30. The imaging block 20 and the signal processing block 30 are electrically connected to each other via connection lines (internal buses) CL1, CL2, and CL3.

The imaging block 20 includes an imaging unit 21, an imaging processing unit 22, an output control unit 23, an output interface (I/F) 24, and an imaging control unit 25 and captures an image.

The imaging unit 21 has a configuration in which a plurality of pixels is arranged two-dimensionally. The imaging unit 21 is driven by the imaging processing unit 22 and captures an image.

That is, light from the optical system 1 (FIG. 1) is incident on the imaging unit 21. Each pixel of the imaging unit 21 receives incident light from the optical system 1, performs photoelectric conversion, and outputs an analog image signal corresponding to the incident light.

Incidentally, the size of an image (signal) output from the imaging unit 21 can be selected, for example, from a plurality of sizes such as 12M (3968×2976) pixels or a video graphics array (VGA) size (640×480 pixels).

Further, an image selected from the imaging unit 21 can be set to be selected, for example, from a color image of RGB (red, green, and blue) and a monochrome image with only luminance.

This selection can be carried out as a kind of setting of an imaging mode.

The imaging processing unit 22 performs an imaging process associated with capturing an image in the imaging unit 21 such as driving of the imaging unit 21, analog-to-digital (AD) conversion of an analog image signal output from the imaging unit 21, and imaging signal processing, according to the control of the imaging control unit 25.

Here, examples of the imaging signal processing include a process of calculating brightness for each predetermined sub area, for example, by calculating an average value of pixel values for each sub area in an image output from the imaging unit 21, a process of converting an image output from the imaging unit 21 into a high dynamic range (HDR) image, defect correction, development, and the like.

The imaging processing unit 22 outputs a digital image signal (herein, for example, an image with 12M pixels or a VGA size), which is acquired by AD conversion or the like of an analog image signal output from the imaging unit 21, as a captured image.

The captured image output from the imaging processing unit 22 is supplied to the output control unit 23 and is supplied to an image compressing unit 35 of the signal processing block 30 via the connection line CL2.

The output control unit 23 is supplied with a captured image from the imaging processing unit 22 and is also supplied with a signal processing result of signal processing using the captured image or the like from the signal processing block 30 via the connection line CL3.

The output control unit 23 performs output control of selectively outputting the captured image from the imaging processing unit 22 and the signal processing result from the signal processing block 30 from the (single) output I/F 24 to the outside (for example, the memory 3 or the like in FIG. 1).

That is, the output control unit 23 selects the captured image from the imaging processing unit 22 or the signal processing result from the signal processing block 30 and supplies the selected one to the output I/F 24.

The output I/F 24 is an I/F that outputs the captured image and the signal processing result supplied from the output control unit 23 to the outside. For example, a relatively fast parallel I/F such as a mobile industry processor interface (MIPI) or the like can be employed as the output I/F 24.

The output I/F 24 outputs the captured image from the imaging processing unit 22 or the signal processing result from the signal processing block 30 to the outside in accordance with the output control of the output control unit 23. Accordingly, for example, in a case where the outside requires only the signal processing result from the signal processing block 30 and does not require the captured image, only the signal processing result can be output and it is thus possible to reduce an amount of data which is output from the output I/F 24 to the outside.

Further, by causing the signal processing block 30 to perform signal processing through which a signal processing result required from the outside and to output the signal processing result from the output I/F 24, signal processing does not need to be performed in the outside and it is thus possible to reduce a load of an external block.

The imaging control unit 25 includes a communication I/F 26 and a register group 27.

The communication I/F 26 is a first communication I/F such as a serial communication I/F such as an inter-integrated circuit (I2C) and performs exchange of necessary information such as information which is read from and written to the register group 27 with the outside (for example, the control unit 6 or the like in FIG. 1).

The register group 27 includes a plurality of registers and stores a variety of information such as imaging information associated with capturing an image in the imaging unit 21.

For example, the register group 27 stores imaging information received from the outside by the communication I/F 26 or results of imaging signal processing (for example, brightness for each sub area in a captured image or the like) in the imaging processing unit 22.

Examples of the imaging information stored in the register group 27 include (information indicating) ISO sensitivity (an analog gain at the time of AD conversion in the imaging processing unit 22), an exposure time (a shutter speed), a frame rate, a focus, an imaging mode, a cutting area, and the like.

The imaging mode includes, for example, a manual mode in which an exposure time, a frame rate, and the like are manually set and an automatic mode in which they are automatically set depending on scenes. The automatic mode includes, for example, modes according to various imaged scenes such as a night scene and a face of a person.

Further, the cutting area refers to an area which is cut from an image output from the imaging unit 21 in a case where the imaging processing unit 22 cuts a part of the image output from the imaging unit 21 and outputs the cut image as a captured image. By designating the cutting area, only an area in which a person appears can be cut, for example, from an image output from the imaging unit 21. Incidentally, cutting of an image can employ a method of cutting an area from an image output from the imaging unit 21 and a method of reading only an image (signal) in a cutting area from the imaging unit 21.

The imaging control unit 25 controls the imaging processing unit 22 according to imaging information stored in the register group 27 and thus controls capturing an image in the imaging unit 21.

Incidentally, the register group 27 can store output control information associated with output control in the output control unit 23 in addition to imaging information and results of imaging signal processing in the imaging processing unit 22. The output control unit 23 can perform output control of selectively outputting a captured image and a signal processing result according to the output control information stored in the register group 27.

Further, in the imaging device 2, the imaging control unit 25 and a CPU 31 of the signal processing block 30 are connected to each other via the connection line CL1, and the CPU 31 can perform reading and writing information from and to the register group 27 via the connection line CL1.

That is, in the imaging device 2, reading and writing of information from and to the register group 27 can be performed by the communication I/F 26 and can also be performed by the CPU 31.

The signal processing block 30 includes the central processing unit (CPU) 31, a digital signal processor (DSP) 32, a memory 33, a communication I/F 34, the image compressing unit 35, and an input I/F 36, and performs predetermined signal processing using a captured image or the like acquired from the imaging block 10.

The CPU 31 to the input I/F 36 constituting the signal processing block 30 are connected to each other via a bus and can perform exchange of information if necessary.

The CPU 31 performs control of the signal processing block 30, reading and writing information from and to the register group 27 of the imaging control unit 25 via the connection line CL1, and other processing by executing a program stored in the memory 33.

For example, by executing the program, the CPU 31 functions as an imaging information calculating unit that calculates imaging information using a signal processing result acquired through signal processing in the DSP 32, feeds back new imaging information calculated using the signal processing result to the register group 27 of the imaging control unit 25 via the connection line CL1, and stores the new imaging information therein.

Accordingly, the CPU 31 can control capturing an image in the imaging unit 21 or imaging signal processing in the imaging processing unit 22 according to the signal processing result of the captured image.

Further, the imaging information which is stored in the register group 27 by the CPU 31 can be provided (output) from the communication I/F 26 to the outside. For example, information associated with a focus out of the imaging information stored in the register group 27 can be provided to a focus driver (not illustrated) that controls the focus from the communication I/F 26.

By executing a program stored in the memory 33, the DSP 32 functions as a signal processing unit that performs signal processing using a captured image supplied from the imaging processing unit 22 to the signal processing block 30 via the connection line CL2 or information received from the outside by the input I/F 36.

The memory 33 includes a static random access memory (SRAM), a dynamic RAM (DRAM), or the like, and stores data necessary for processing in the signal processing block 30 or the like.

For example, the memory 33 stores a program which is received from the outside via the communication I/F 34, a captured image which is compressed by the image compressing unit 35 and used for signal processing in the DSP 32, a signal processing result of the signal processing which is performed by the DSP 32, information which is received by the input I/F 36, and the like.

The communication I/F 34 is, for example, a second communication I/F such as a serial communication I/F such as a serial peripheral interface (SPI), and exchange of necessary information such as a program which is executed by the CPU 31 or the DSP 32 with the outside (for example, the memory 3, the control unit 6, or the like in FIG. 1).

For example, the communication I/F 34 downloads a program which is executed by the CPU 31 or the DSP 32 from the outside, supplies the program to the memory 33, and stores the program therein.

Accordingly, the CPU 31 or the DSP 32 can perform various processes using the program which is downloaded by the communication I/F 34.

Incidentally, the communication I/F 34 can perform exchange of arbitrary data in addition to the program with the outside. For example, the communication I/F 34 can output a signal processing result which is acquired through signal processing in the DSP 32 to the outside. Further, the communication I/F 34 can output information based on an instruction from the CPU 31 to an external device and thus control the external device in accordance with the instruction from the CPU 31.

Here, the signal processing result which is acquired through the signal processing in the DSP 32 can be output to the outside via the communication I/F 34 and can be written to the register group 27 of the imaging control unit 25 by the CPU 31. The signal processing result written to the register group 27 can be output to the outside via the communication I/F 26. The same is true of a processing result of processing which is performed by the CPU 31.

The image compressing unit 35 is supplied with a captured image from the imaging processing unit 22 via the connection line CL2. The image compressing unit 35 performs a compression process of compressing the captured image and generates a compressed image of which an amount of data is less than that of the captured image.

The compressed image generated by the image compressing unit 35 is supplied to the memory 33 via a bus and stored therein.

Here, signal processing in the DSP 32 can be performed using the captured image and can also be performed using the compressed image generated from the captured image by the image compressing unit 35. Since the amount of data of the compressed image is less than that of the captured image, it is possible to achieve a decrease in load of signal processing in the DSP 32 or saving of a memory capacity of the memory 33 that stores the compressed image.

For example, scale-down of converting a captured image of 12M (3968×2976) pixels into an image with a VGA size can be performed as the compression process which is performed by the image compressing unit 35. Further, in a case where the signal processing in the DSP 32 is performed on luminance and the captured image is an RGB image, YUV conversion of converting the RGB image into, for example, a YUV image can be performed as the compression process.

Incidentally, the image compressing unit 35 may be embodied in software or may be embodied in dedicated hardware.

The input I/F 36 is an I/F that receives information from the outside. For example, the input I/F 36 receives an output of an external sensor (an external sensor output) from the external sensor, supplies the external sensor output to the memory 33 via a bus, and stores the external sensor output therein.

For example, similarly to the output I/F 24, a parallel I/F such as a mobile industry processor interface (MIPI) or the like can be employed as the input I/F 36.

Further, for example, a range sensor that senses information associated with a distance can be employed as the external sensor. Furthermore, for example, an image sensor that senses light and outputs an image corresponding to the light, that is, an image sensor which is different from the imaging device 2, can be employed as the external sensor.

The DSP 32 can perform signal processing using the external sensor output which is received from the external sensor by the input I/F 36 and stored in the memory 33 in addition to (a compressed image generated from) a captured image.

In the single-chip imaging device 2 having the above-mentioned configuration, signal processing using (a compressed image generated from) a captured image acquired through imaging in the imaging unit 21 is performed by the DSP 32, and the signal processing result of the signal processing and the captured image are selectively output from the output I/F 24. Accordingly, it is possible to construct an imaging device that outputs information required by a user with a small size.

Here, in a case where the imaging device 2 does not perform signal processing of the DSP 32 and the imaging device 2 does not output a signal processing result but outputs a captured image, that is, in a case where the imaging device 2 is configured as an image sensor that only captures and outputs an image, the imaging device 2 can be constituted by only the imaging block 20 in which the output control unit 23 is not provided.

Figure 3:
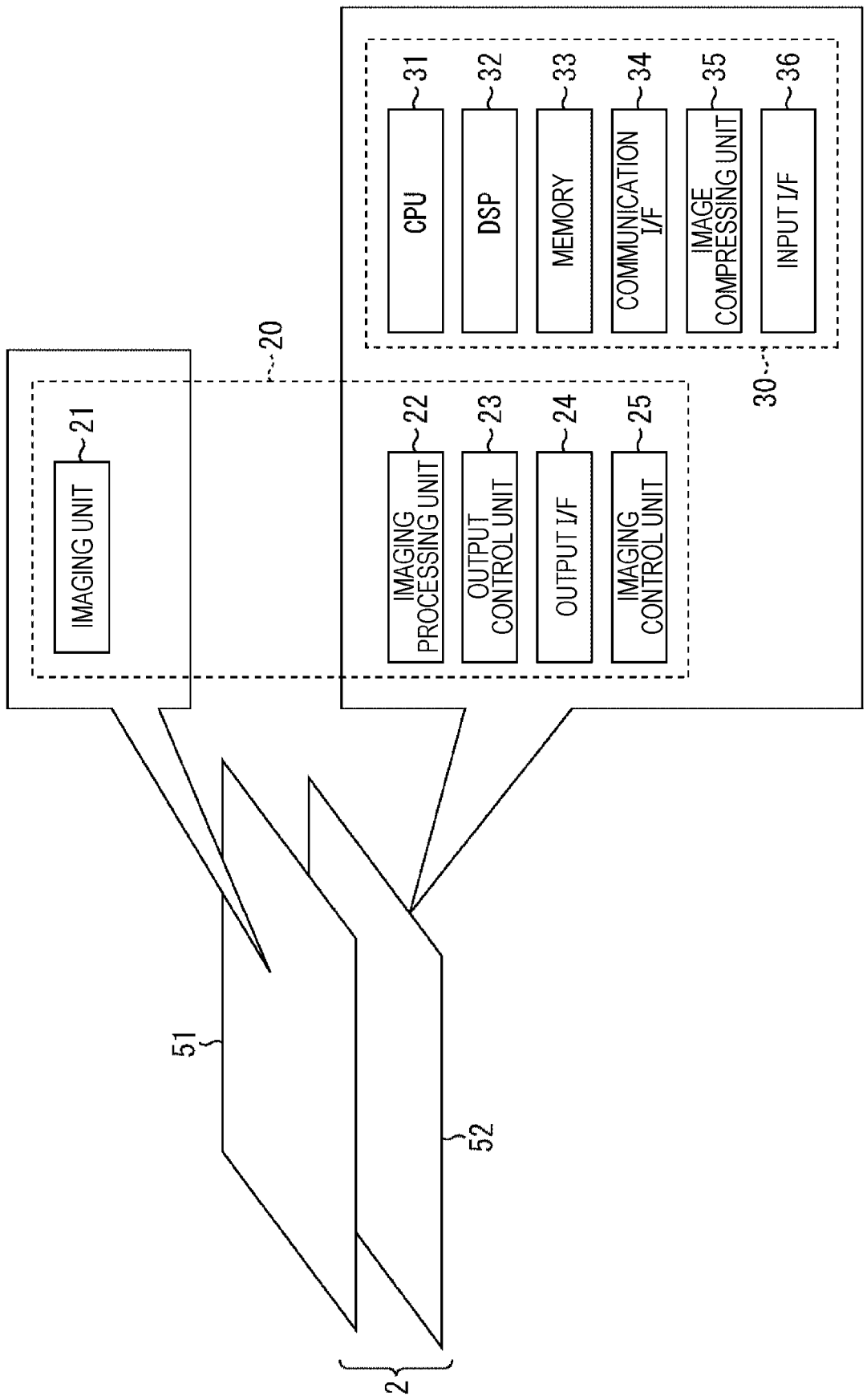
FIG. 3 is a perspective view illustrating an example of an outline configuration of the imaging device 2.

FIG. 3 is a perspective view illustrating an example of an outline configuration of the imaging device 2 illustrated in FIG. 1.

The imaging device 2 can be configured, for example, as a single-chip semiconductor device having a stacked structure in which a plurality of dies is stacked as illustrated in FIG. 3.

In FIG. 3, the imaging device 2 has a configuration in which two dies including dies 51 and 52 are stacked.

In FIG. 3, the imaging unit 21 is mounted in the upper die 51, and the imaging processing unit 22 to the imaging control unit 25 and the CPU 31 to the input I/F 36 are mounted in the lower die 52.

The upper die 51 and the lower die 52 are electrically connected to each other, for example, by forming a through-hole penetrating the die 51 and reaching the die 52 or by performing Cu—Cu bonding of directly connecting a Cu wire exposed from the bottom surface of the die 51 and a Cu wire exposed from the top surface of the die 52.

Here, for example, a column-parallel AD system or an area AD system can be employed as a system for performing AD conversion of an image signal output from the imaging unit 21 in the imaging processing unit 22.

In the column-parallel AD system, AD conversion of an image signal of pixels in the columns of one row is performed I parallel, for example, by providing an AD converter (ADC) for each column of pixels constituting the imaging unit 21 and causing the ADC for each column to take charge of AD conversion of the pixel signals of the pixels in the column. In a case where the column-parallel AD system is employed, a part of the imaging processing unit 22 that performs the AD conversion in the column-parallel AD system may be mounted in the upper die 51.

In the area AD system, pixels constituting the imaging unit 21 are partitioned into a plurality of blocks and an ADC is provided for each block. In addition, AD conversion of the image signals of the pixels in the plurality of blocks is performed in parallel by causing the ADC of each block to take charge of AD conversion of pixel signals of the pixels in the block. In the area AD system, AD conversion (reading and AD conversion) of an image signal can be performed on only necessary pixels out of the pixels constituting the imaging unit 21 with a block as a minimum unit.

Incidentally, when an increase in area of the imaging device 2 is permitted, the imaging device 2 can be constituted by one die.

Further, in FIG. 3, two dies 51 and 52 are stacked to constitute a single-chip imaging device 2, but the single-chip imaging device 2 may be constituted by stacking three or more dies. For example, in a case where three dies are stacked to constitute a single-chip imaging device 2, the memory 33 illustrated in FIG. 3 may be mounted in a different die.

Here, in an imaging device (hereinafter also referred to as a bump-connected imaging device) in which a sensor chip, a memory chip, and a DSP chip are connected in parallel using a plurality of bumps as described in Patent Document 1, the thickness is larger than that of the single-chip imaging device 2 constituted in a stacked structure and the size thereof is larger.

Furthermore, in the bump-connected imaging device, it may be difficult to secure a sufficient rate as a rate at which a captured image is output from the imaging processing unit 22 to the output control unit 23 due to signal deterioration or the like in connection portions between the bumps.

With the imaging device 2 having a stacked structure, it is possible to prevent an increase in size of the device or to prevent a sufficient rate from being secured as a rate between the imaging processing unit 22 and the output control unit 23.

Accordingly, with the imaging device 2 having a stacked structure, it is possible to achieve construction of an imaging device that outputs information required by a user with a small size.

In a case where the information required by a user is a captured image, the imaging device 2 can output the captured image.

Further, in a case where the information required by a user is acquired through signal processing using a captured image, the imaging device 2 can acquire and output a signal processing result as the information required by the user by causing the DSP 32 to perform the signal processing.

For example, a recognition process of recognizing a predetermined recognition object from a captured image can be employed as the signal processing which is performed by the imaging device 2, that is, the signal processing of the DSP 32.

Further, for example, the imaging device 2 can receive an output of a range sensor such as a time of flight (ToF) sensor which is arranged with a predetermined positional relationship with the imaging device 2 via the input I/F 36. In this case, for example, a fusion process of combining the output of the range sensor and the captured image to calculate a distance with high accuracy such as a process of removing nose of a range image acquired from the output of the range sensor received via the input I/F 36 using the captured image can be employed as the signal processing of the DSP 32.

Furthermore, for example, the imaging device 2 can receive an image output from an image sensor, which is arranged to have a predetermined positional relationship with the imaging device 2, via the input I/F 36. In this case, for example, a self-localization process (simultaneously localization and mapping (SLAM)) using an image received via the input I/F 36 and a captured image as stereo images can be employed as the signal processing of the DSP 32.

Hereinafter, processing of the imaging device 2 in a case where the recognition process, the fusion process, and the self-localization process (hereinafter also referred to as an SLAM process) are performed as the signal processing of the DSP 32 will be described.

Incidentally, the order of processes which are performed the imaging device 2 which will be described below can be changed in a possible range. That is, the order of processes which are performed in the imaging device 2 is not limited to the following order.

<Processing Example of Imaging Device 2 in Case where Recognition Process is Performed as Signal Processing in DSP 32>

Figure 4:
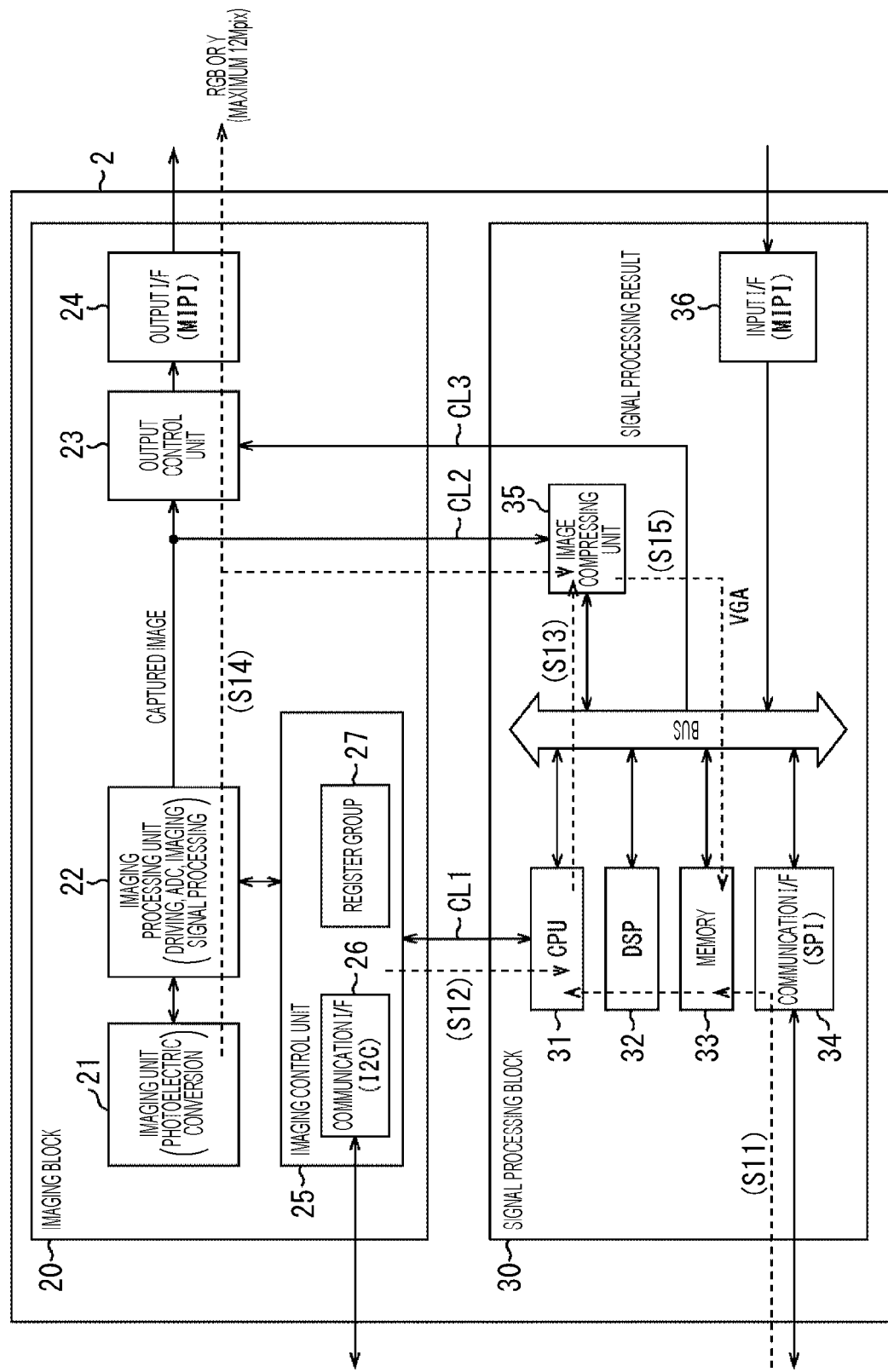
FIG. 4 is a diagram describing an outline of a processing example of the imaging device 2 in a case where a recognition process is performed as signal processing of a DSP 32.
Figure 5:
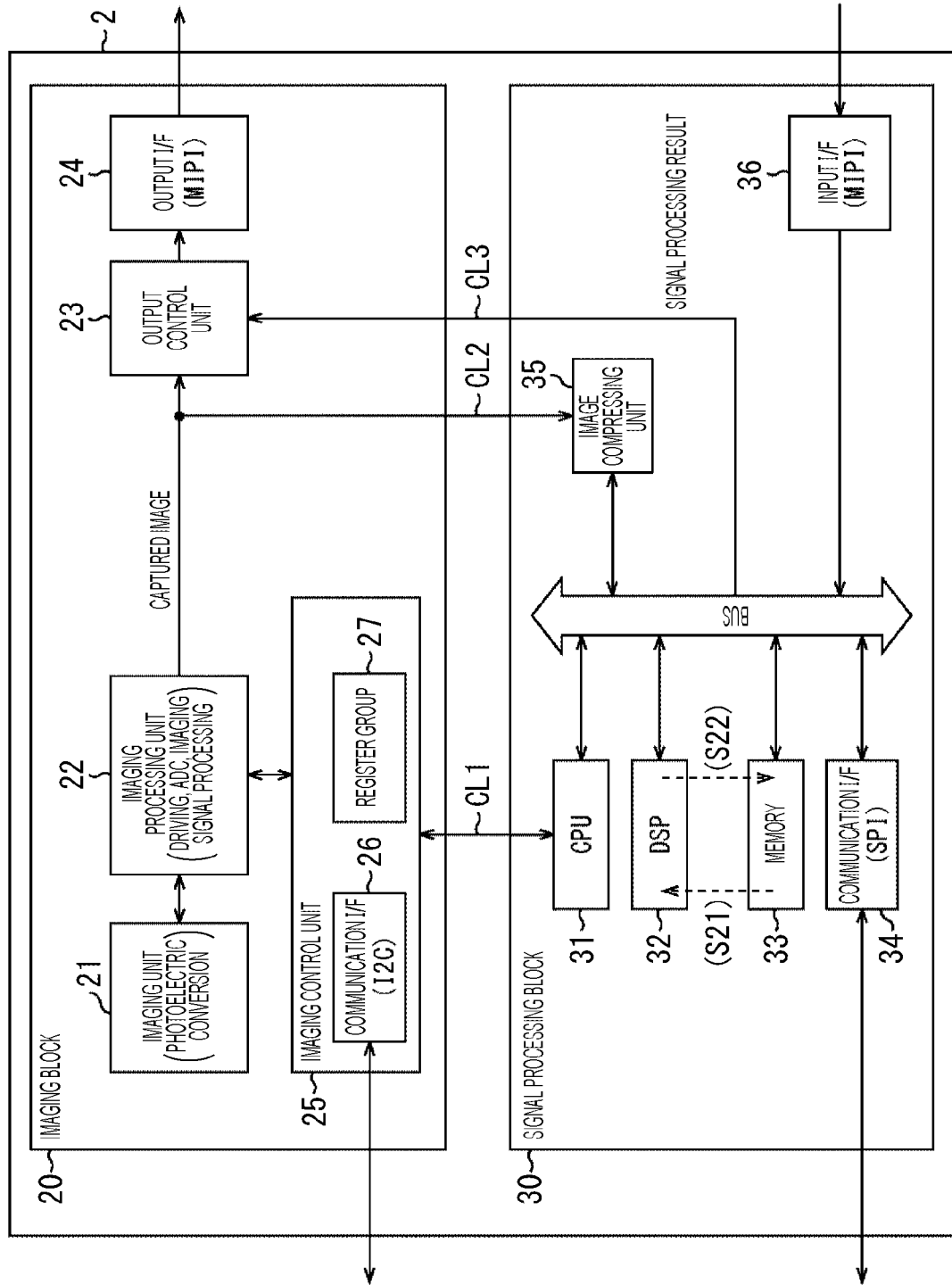
FIG. 5 is a diagram describing an outline of a processing example of the imaging device 2 in a case where a recognition process is performed as signal processing of the DSP 32.
Figure 6:
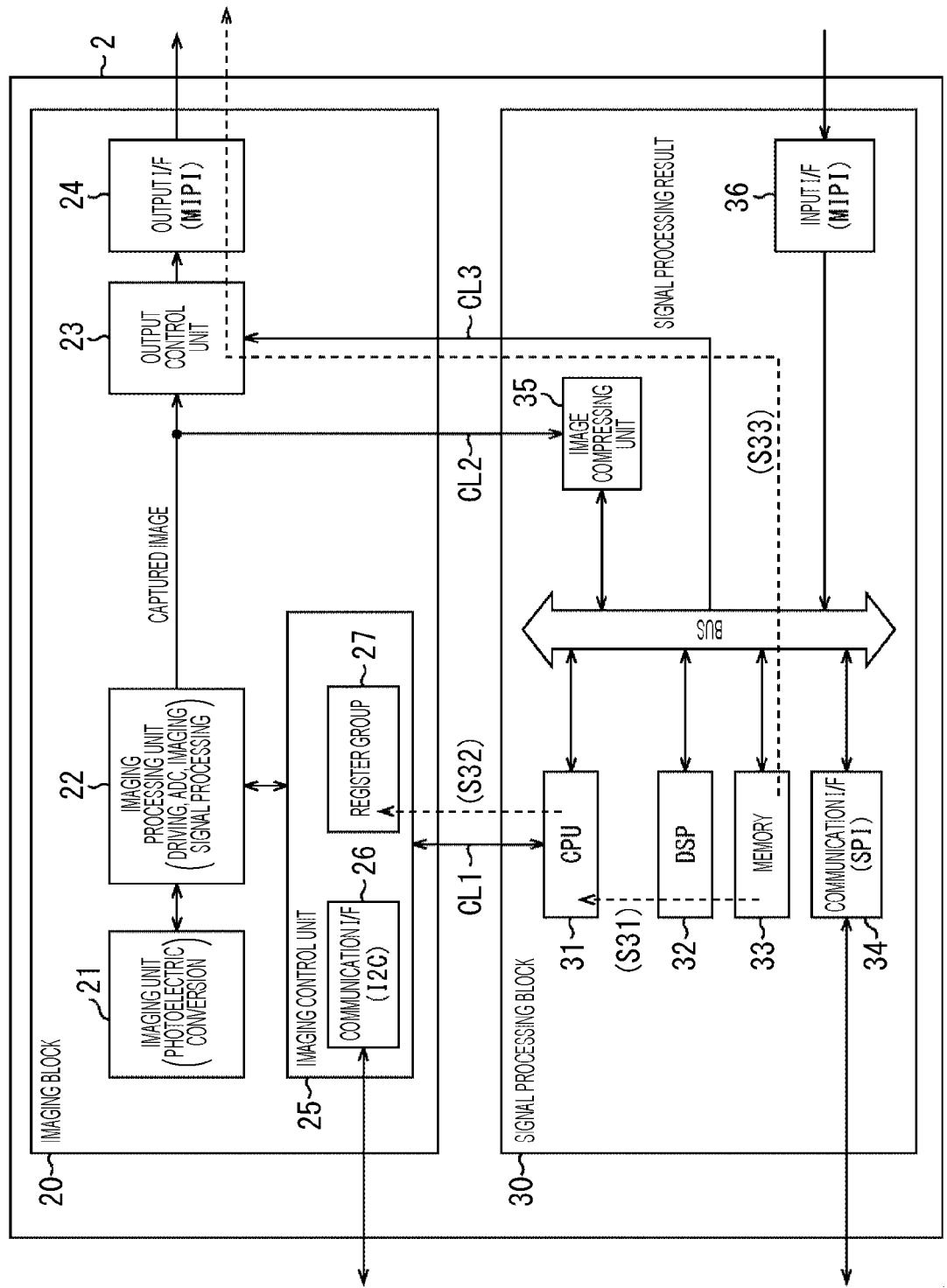
FIG. 6 is a diagram describing an outline of a processing example of the imaging device 2 in a case where a recognition process is performed as signal processing of the DSP 32.

FIGS. 4, 5, and 6 are diagrams describing an outline of a processing example of the imaging device 2 in a case where the recognition process is performed as signal processing of the DSP 32.

In Step S11 of FIG. 4, the communication I/F 34 downloads a program (a code) which is executed by the CPU 31 and the DSP 32 from the outside and stores the program in the memory 33 in performing the recognition process as the signal processing of the DSP 32. Here, the program which is executed by the DSP 32 is a recognition processing program for performing a recognition process as the signal processing.

The CPU 31 starts a predetermined process by executing a program stored in the memory 33.

That is, in Step S12, the CPU 31 reads (information of) brightness for each sub area of a captured image and other necessary information from the register group 27 via the connection line CL1.

In Step S13, the CPU 31 performs control associated with the compression process such as determining a reduction rate indicating a degree of scaling-down of a captured image as the compression process in the image compressing unit 35.

In Step S14, the imaging unit 21 starts capturing of an image, and the imaging processing unit 22 starts outputting of an image from the imaging unit 21 as a captured image. Accordingly, supply of a captured image from the imaging processing unit 22 to the output control unit 23 and supply of the captured image from the imaging processing unit 22 to the image compressing unit 35 via the connection line CL2 are started.

The captured image supplied from the imaging processing unit 22 to the output control unit 23 is selected by the output control unit 23 if necessary and is output from the output I/F 24 to the outside.

In Step S15, the image compressing unit 35 starts a compression process of a captured image supplied from the imaging processing unit 22 via the connection line CL2.

Here, an image output from the imaging unit 21 as well as an image output from the image processing unit 22 is referred to as a captured image in the following description.

As described above with reference to FIG. 2, the imaging unit 21 can output a captured image of, for example, 12M pixels or a VGA size. Furthermore, the imaging unit 21 can output, for example, a color image of RGB (red, green, and blue) or a monochrome image as a captured image.

In a case where a captured image is a full-size image of 12M pixels, the image compressing unit 35 performs, for example, a process of scaling down the captured image of 12M pixels into a captured image of a VGA size or the like as the compression process.

Here, in a case where the captured image has a scaled-down size, that is, an image of a VGA size herein, the image compressing unit 35 does not perform the scaling-down process.

Further, in a case where the captured image is a color image of RGB, the image compressing unit 35 performs YUV conversion as the compression process, for example, to convert a color captured image into a monochrome captured image.

Here, in a case where the captured image is a monochrome image, the image compressing unit 35 does not perform YUV conversion.

Accordingly, for example, in a case where the captured image is a color image of 12M pixels, the image compressing unit 35 performs scaling-down and YUV conversion of the captured image as the compression process.

Further, for example, in a case where the captured image is a color image of a VGA size, the image compressing unit 35 performs YUV conversion of the captured image as the compression process.

The image compressing unit 35 stores the monochrome captured image of a VGA size acquired as the result of the compression result as a compressed image in the memory 33.

Incidentally, the imaging device 2 can be constituted without providing the image compressing unit 35. Here, in a case where the imaging device 2 is constituted without providing the image compressing unit 35, the load of the DSP 32 or the memory capacity required for the memory 33 increases.

In Step S21 of FIG. 5, the DSP 32 starts a recognition process as signal processing corresponding to a recognition processing program by reading and executing the recognition processing program stored in the memory 33 in Step S11.

That is, the DSP 32 sequentially reads areas of a compressed image stored in the memory 33 as a recognition process target from the memory 33 and performs a recognition process of recognizing a predetermined recognition object (for example, a face of a person or the like) from the processing target as signal processing using the compressed image (further the captured image).

The recognition process can be performed, for example, using a technique such as deep learning of a convolutional neural network (CNN) or the like. Further, in the recognition process, a specific subject such as a face of a person can be detected with the specific subject as a recognition target, and a scene appearing in the image can also be detected with the scene appearing in the image as a recognition target.

In Step S22, the DSP 32 supplies the result of the recognition process as a signal processing result to the memory 33 and stores the result of the recognition process therein. The result of the recognition process (hereinafter also referred to as a recognition result) includes, for example, information about whether a recognition target has been detected, information of a detection position at which the recognition target has been detected, or the like.

Incidentally, in the recognition process, gradation conversion of the compressed image such as setting average brightness of the compressed image to a predetermined fixed value can be performed in order to prevent luminance of a compressed image (a captured image) from affecting recognition accuracy. This gradation conversion can be performed using brightness for each sub area of the captured image which is read from the register group 27 by the CPU 31 in Step S12 of FIG. 4.

In Step S31 of FIG. 6, the CPU 31 reads a recognition result as a signal processing result stored in the memory 33 and performs an operation of calculating imaging information such as an exposure time suitable for capturing a captured image using the recognition result.

For example, in a case where the recognition result includes a detection position of a face which is a recognition target, the CPU 31 calculates an exposure time suitable for imaging a face appearing at the detection position according to the luminance or the like of the detection position of the face in the compressed image (the captured image). Further, for example, the CPU 31 calculates imaging information for controlling automatic focusing such that a focus is set on the detection position of the face.

In addition, the CPU 31 calculates imaging information such as a frame rate, an imaging mode, and a cutting area suitable for capturing a captured image using the recognition result if necessary.

In Step S32, the CPU 31 feeds back the imaging information calculated in Step S31 to the register group 27 via the connection line CL1. The register group 27 newly stores the imaging information fed back from the CPU 31 and then the imaging control unit 25 controls the imaging processing unit 22 on the basis of the imaging information newly stored in the register group 27.

In Step S33, the CPU 31 reads the recognition result as the signal processing result stored in the memory 33 and supplies the recognition result to the output control unit 23.

The recognition result as the signal processing result supplied from the memory 33 to the output control unit 23 is selected by the output control unit 23 if necessary and is output from the output I/F 24 to the outside.

Figure 7:
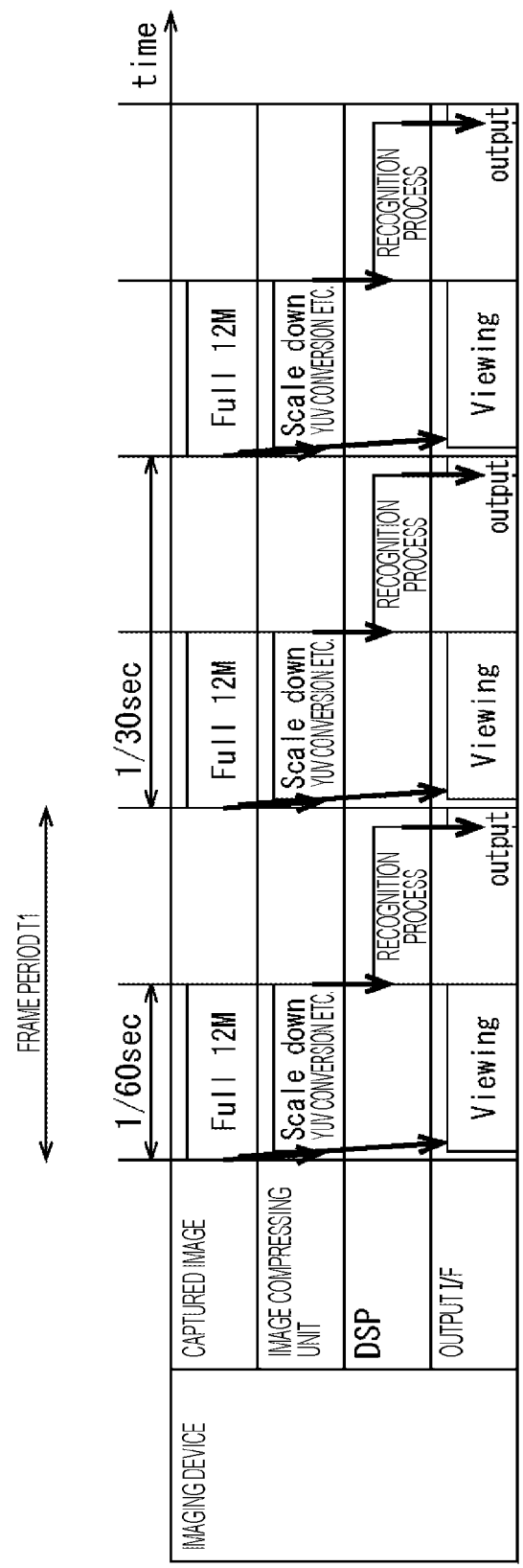
FIG. 7 is a timing diagram describing a first example of a processing time of the imaging device 2 in a case where a recognition process is performed as signal processing of the DSP 32.

FIG. 7 is a timing diagram describing a first example of a processing time of the imaging device 2 in a case where a recognition process is performed as signal processing of the DSP 32.

For example, the imaging unit 21 captures an image of one frame for 1/60 seconds in the first half of a frame period T1 with 1/30 seconds as the frame period T1. A captured image acquired through imaging of the imaging unit 21 is supplied from the imaging processing unit 22 to the output control unit 23 and the image compressing unit 35.

Incidentally, in FIG. 7, the captured image is assumed to be a color image of 12M pixels.

When the captured image is supplied from the imaging processing unit 22, the output control unit 23 selects the captured image and outputs the selected captured image from the output I/F 24 to the outside.

In the image compressing unit 35, scale-down and YUV conversion are performed as the compression process of the color captured image of 12M pixels, and the color captured image of 12M pixels is converted into a monochrome compressed image of a VGA size. This compressed image is stored in the memory 33.

Here, when a certain frame period T1 is noticed, the frame period T1 is also referred to as a noticed frame period T1.

In FIG. 7, the compression process of the captured image in the noticed frame period T1 (captured for 1/60 seconds in the first half) ends in the first half of the noticed frame period T1, and then the DSP 32 starts a recognition process using the compressed image stored in the memory 33, that is, the compressed image acquired from the captured image in the noticed frame period T1 at a time at which 1/60 seconds in the second half of the noticed frame period T1 starts.

At a time slightly before the noticed frame period T1 ends, the DSP 32 ends the recognition process using the compressed image acquired from the captured image in the noticed frame period T1 and supplies the recognition result of the recognition process as a signal processing result to the output control unit 23.

When the recognition result as a signal processing result is supplied, the output control unit 23 selects the signal processing result and outputs the signal processing result from the output I/F 24 to the outside.

In FIG. 7, the signal processing result in the noticed frame period T1, that is, the signal processing result (the recognition result) of the recognition process using the compressed image acquired from the captured image in the noticed frame period T1, is output from the output I/F 24 in a period from a time immediately before the noticed frame period T1 ends to the time at which the noticed frame period T1 ends.

Figure 8:
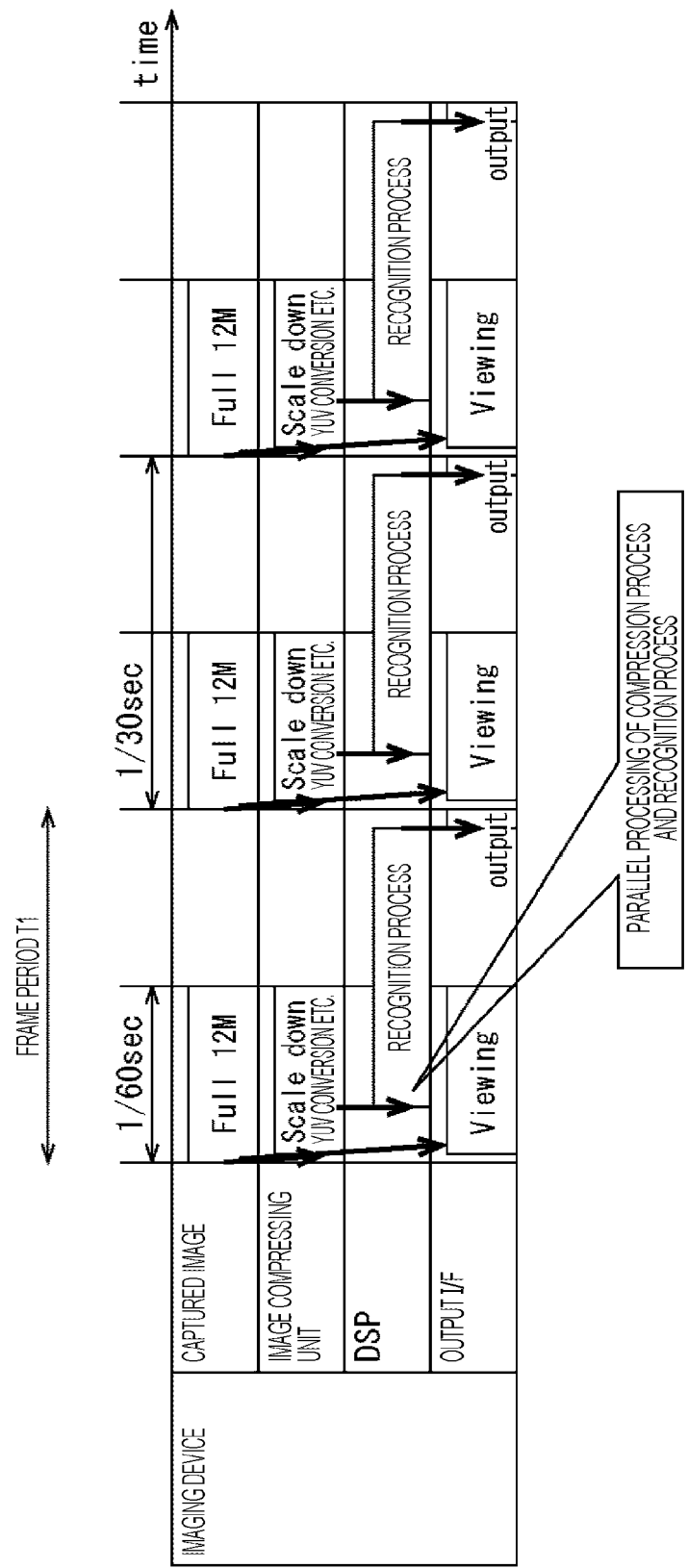
FIG. 8 is a timing diagram describing a second example of a processing time of the imaging device 2 in a case where a recognition process is performed as signal processing of the DSP 32.

FIG. 8 is a timing diagram describing a second example of a processing time of the imaging device 2 in a case where a recognition process is performed as signal processing of the DSP 32.

In FIG. 8, similarly to FIG. 7, the imaging unit 21 captures an image of one frame for 1/60 seconds in the first half of a frame period T1 with 1/30 seconds as the frame period T1 and a color captured image of 12M pixels is acquired. The captured image acquired by the imaging unit 21 is supplied from the imaging processing unit 22 to the output control unit 23 and the image compressing unit 35.

Similarly to FIG. 7, when the captured image is supplied from the imaging processing unit 22, the output control unit 23 selects the captured image and outputs the selected captured image from the output I/F 24 to the outside.

In the image compressing unit 35, similarly to FIG. 7, scale-down and YUV conversion are performed as the compression process of the color captured image of 12M pixels, and the color captured image of 12M pixels is converted into a monochrome compressed image of a VGA size. This compressed image is stored in the memory 33.

In FIG. 8, similarly to FIG. 7, the compression process of the captured image in the noticed frame period T1 ends in the first half of the noticed frame period T1.

Here, in FIG. 8, at a time at which apart of a compressed image which is generated by the compression process can be used for the recognition process without waiting of end of the compression process after the compression process has started, the DSP 32 starts the recognition process using (a part of) the compressed image acquired from the captured image in the noticed frame period T1.

Accordingly, in FIG. 8, the compression process and the recognition process are performed in parallel in some period.

At a time slightly before the noticed frame period T1 ends, the DSP 32 ends the recognition process using the compressed image acquired from the captured image in the noticed frame period T1 and supplies the recognition result of the recognition process as a signal processing result to the output control unit 23.

When the recognition result as a signal processing result is supplied, the output control unit 23 selects the signal processing result and outputs the signal processing result from the output I/F 24 to the outside.

In FIG. 8, similarly to FIG. 7, the recognition result of the recognition process using the compressed image acquired from the captured image in the noticed frame period T1 as the signal processing result in the noticed frame period T1 is output from the output I/F 24 in a period from a time immediately before the noticed frame period T1 ends to the time at which the noticed frame period T1 ends.

As described above, in FIG. 8, since the recognition process is started without waiting for end of the compression process, the time for performing the recognition process can be secured longer in comparison with the case illustrated in FIG. 7 in which the recognition process starts after the compression process has ended.

Figure 9:
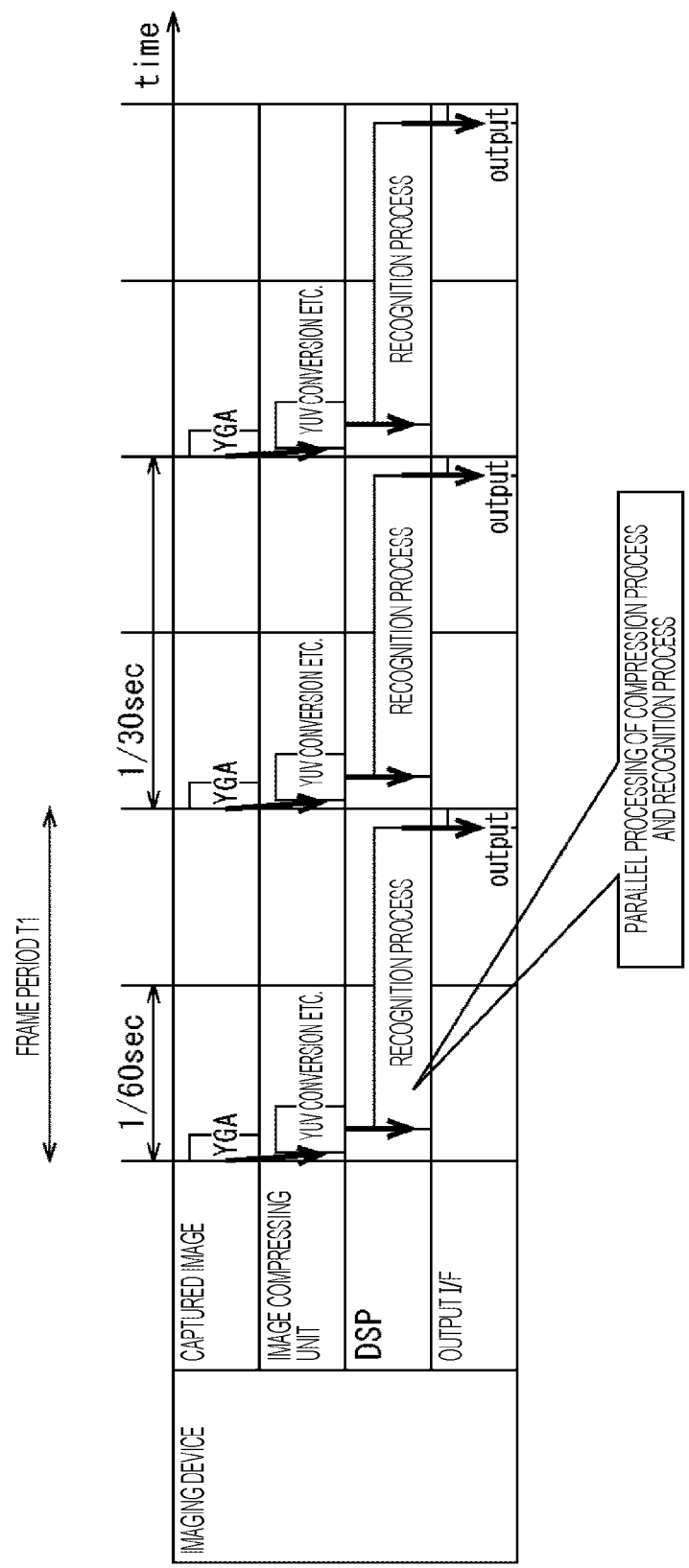
FIG. 9 is a timing diagram describing a third example of a processing time of the imaging device 2 in a case where a recognition process is performed as signal processing of the DSP 32.

FIG. 9 is a timing diagram describing a third example of a processing time of the imaging device 2 in a case where a recognition process is performed as signal processing of the DSP 32.

In FIG. 9, similarly to FIG. 7, the imaging unit 21 captures an image of one frame with 1/30 seconds as a frame period T1. Here, in FIG. 9, the imaging unit 21 captures a color captured image of a VGA size, not a color captured image of 12M pixels. Accordingly, in FIG. 9, capturing of an image in one frame ends for a very short time from start of the frame period T1. The captured image of a VGA size captured by the imaging unit 21 is supplied from the imaging processing unit 22 to the output control unit 23 and the image compressing unit 35.

Here, in FIG. 9, a captured image is not used in the outside, and thus the output control unit 23 does not select the captured image and does not output the captured image from the output I/F 24 to the outside even when the captured image is supplied from the imaging processing unit 22.

The image compressing unit 35 performs a compression process of the captured image and stores a compressed image acquired as a result in the memory 33.

Here, in FIG. 9, since the captured image is a color image of a VGA size, YUV conversion is performed but scale-down is not performed as the compression process. Accordingly, the compression process in FIG. 9 ends for a shorter time in comparison with that in FIG. 7 or 8.

In addition, in FIG. 9, similarly to FIG. 8, at a time at which a part of a compressed image which is generated by the compression process can be used for the recognition process without waiting of end of the compression process after the compression process has started, the DSP 32 starts the recognition process using (a part of) the compressed image acquired from the captured image in the noticed frame period T1.

Accordingly, in FIG. 9, similarly to FIG. 8, the compression process and the recognition process are performed in parallel in some period.

At a time slightly before the noticed frame period T1 ends, the DSP 32 ends the recognition process using the compressed image acquired from the captured image in the noticed frame period T1 and supplies the recognition result of the recognition process as a signal processing result to the output control unit 23.

When the recognition result as a signal processing result is supplied, the output control unit 23 selects the signal processing result and outputs the signal processing result from the output I/F 24 to the outside.

In FIG. 9, similarly to FIG. 7 or 8, the recognition result of the recognition process using the compressed image acquired from the captured image in the noticed frame period T1 as the signal processing result in the noticed frame period T1 is output from the output I/F 24 in a period from a time immediately before the noticed frame period T1 ends to the time at which the noticed frame period T1 ends.

In FIG. 9, similarly to FIG. 8, since the recognition process is started without waiting for end of the compression process, the time for performing the recognition process can be secured longer in comparison with the case illustrated in FIG. 7 in which the recognition process starts after the compression process has ended.

Furthermore, in FIG. 9, since the captured image output from the imaging unit 21 is an image of a VGA size, scale-down may not be performed in the compression process and thus it is possible to reduce a load of the compression process.

As described above, the embodiment in which the captured image output from the imaging unit 21 is not output as an image of a VGA size from the output I/F 24 is useful, for example, in a case where a captured image is not required by the outside and a signal processing result (herein the recognition result of the recognition process) is required.

Figure 10:
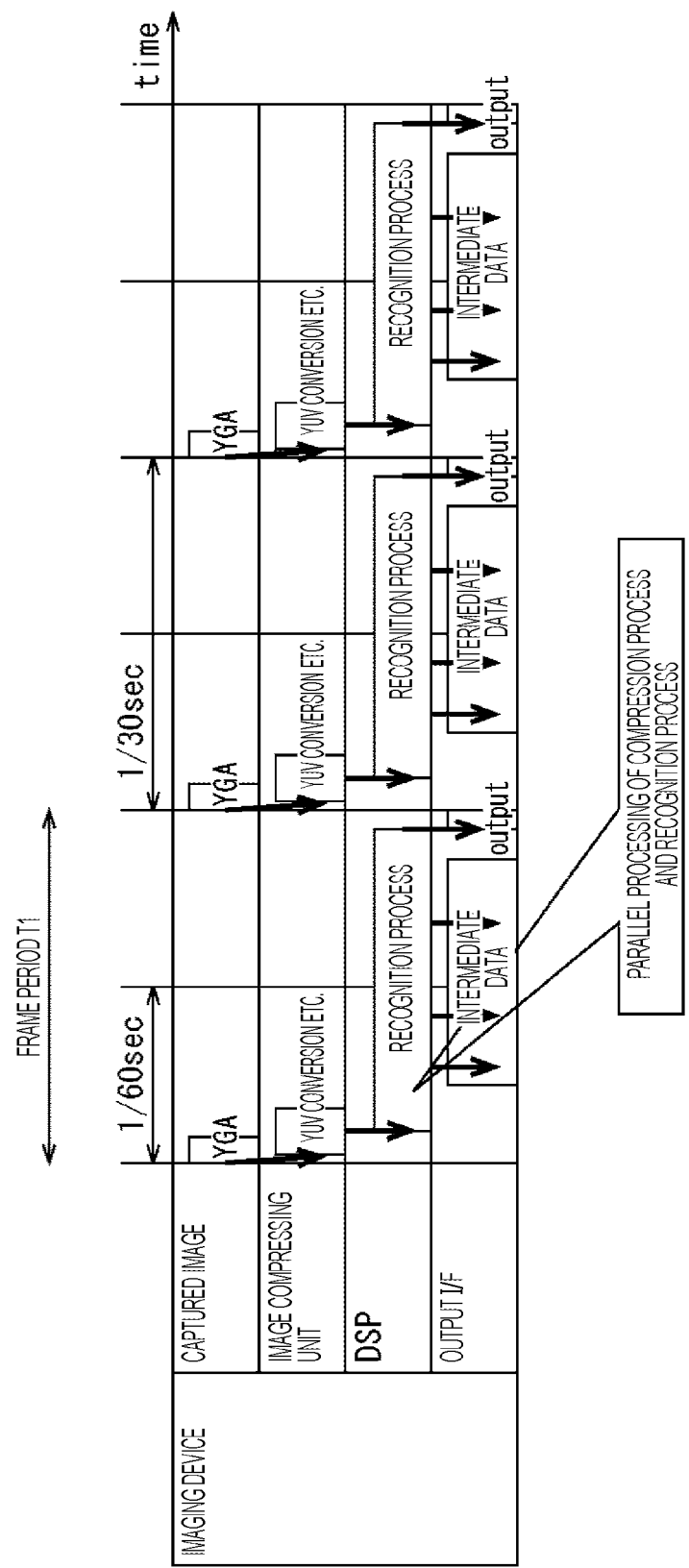
FIG. 10 is a timing diagram describing a fourth example of a processing time of the imaging device 2 in a case where a recognition process is performed as signal processing of the DSP 32.

FIG. 10 is a timing diagram describing a fourth example of a processing time of the imaging device 2 in a case where a recognition process is performed as signal processing of the DSP 32.

In FIG. 10, similarly to FIG. 9, the imaging unit 21 captures a color captured image of a VGA size with ⅟₃₀ seconds as a frame period T1. The captured image captured by the imaging unit 21 is supplied from the imaging processing unit 22 to the output control unit 23 and the image compressing unit 35.

Here, in FIG. 10, similarly to FIG. 9, a captured image is not used in the outside, and thus the output control unit 23 does not output (does not select) the captured image from the output I/F 24 to the outside.

The image compressing unit 35 performs a compression process of the captured image and stores a compressed image acquired as a result in the memory 33.

Here, in FIG. 10, similarly to FIG. 9, since YUV conversion is performed but scale-down is not performed as the compression process, the compression process ends for a shorter time.

In addition, in FIG. 10, similarly to FIG. 8 or 9, at a time at which a part of a compressed image which is generated by the compression process can be used for the recognition process without waiting of end of the compression process after the compression process has started, the DSP 32 starts the recognition process using (a part of) the compressed image acquired from the captured image in the noticed frame period T1.

Accordingly, in FIG. 10, similarly to FIG. 8 or 9, the compression process and the recognition process are performed in parallel in some period.

At a time slightly before the noticed frame period T1 ends, the DSP 32 ends the recognition process using the compressed image acquired from the captured image in the noticed frame period T1 and supplies the recognition result of the recognition process as a signal processing result to the output control unit 23.

Similarly to FIGS. 7 to 9, the output control unit 23 selects the recognition result using the compressed image acquired from the captured image in the noticed frame period T1 as the signal processing result in the noticed frame period T1, and outputs the recognition result from the output I/F 24 immediately before the noticed frame period T1 ends.

In FIG. 10, the DSP 32 appropriately outputs intermediate data acquired in the middle of the recognition process while the recognition process as the signal processing is being performed. The intermediate data output from the DSP 32 is supplied to the output control unit 23, and the output control unit 23 selects the intermediate data and outputs the selected intermediate data from the output I/F 24 similarly to the signal processing result when the intermediate data is supplied.

As described above, in a case where the intermediate data in the middle of the signal processing (herein the recognition process) is output from the output I/F 24 to the outside, the intermediate data can be provided for debugging of the program performing the signal processing (herein the recognition processing program).

<Processing Example of Imaging Device 2 in Case where Fusion Process is Performed as Signal Processing in DSP 32>

Figure 11:
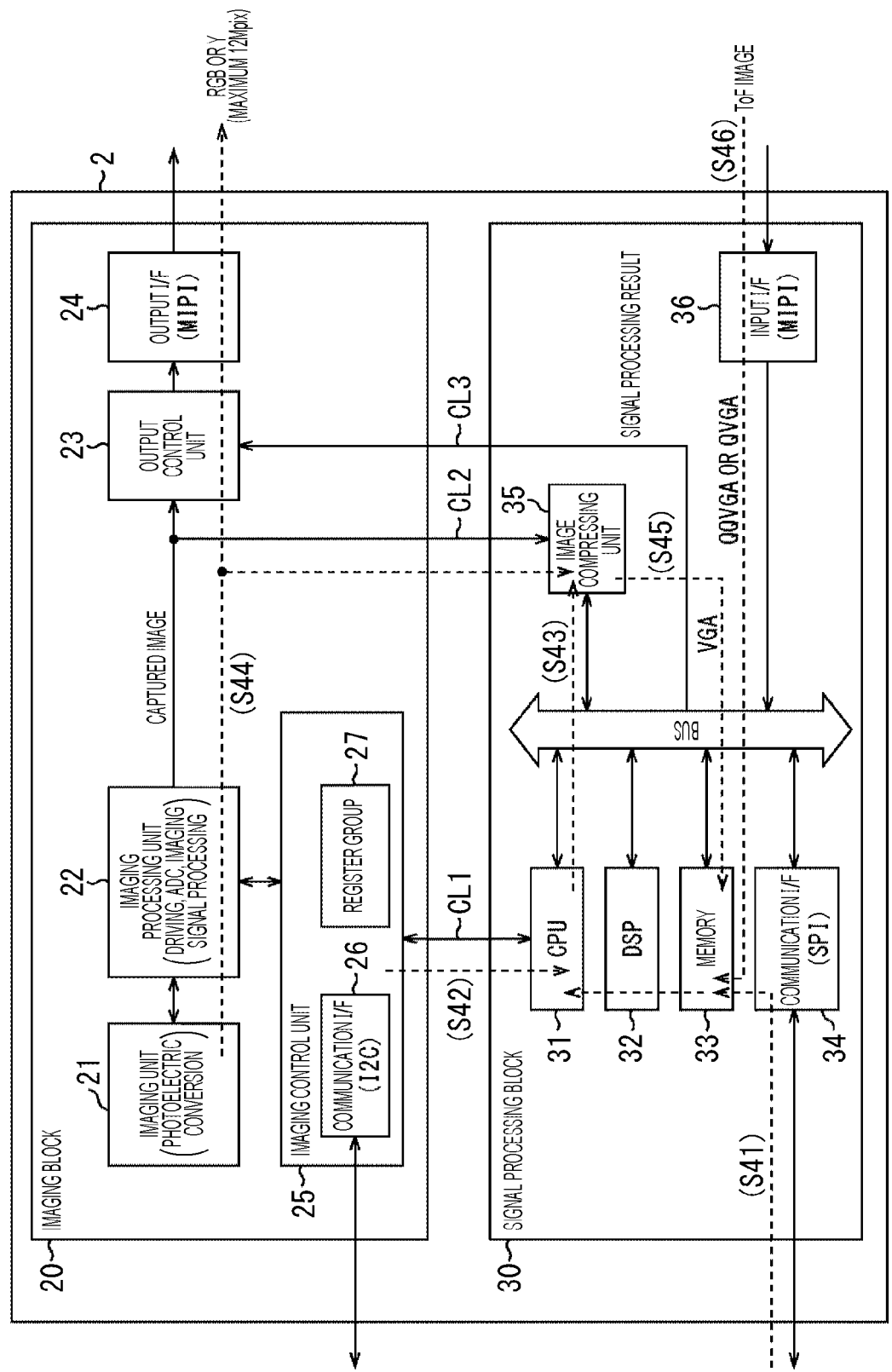
FIG. 11 is a diagram describing an outline of a processing example of the imaging device 2 in a case where a fusion process is performed as signal processing of the DSP 32.
Figure 12:
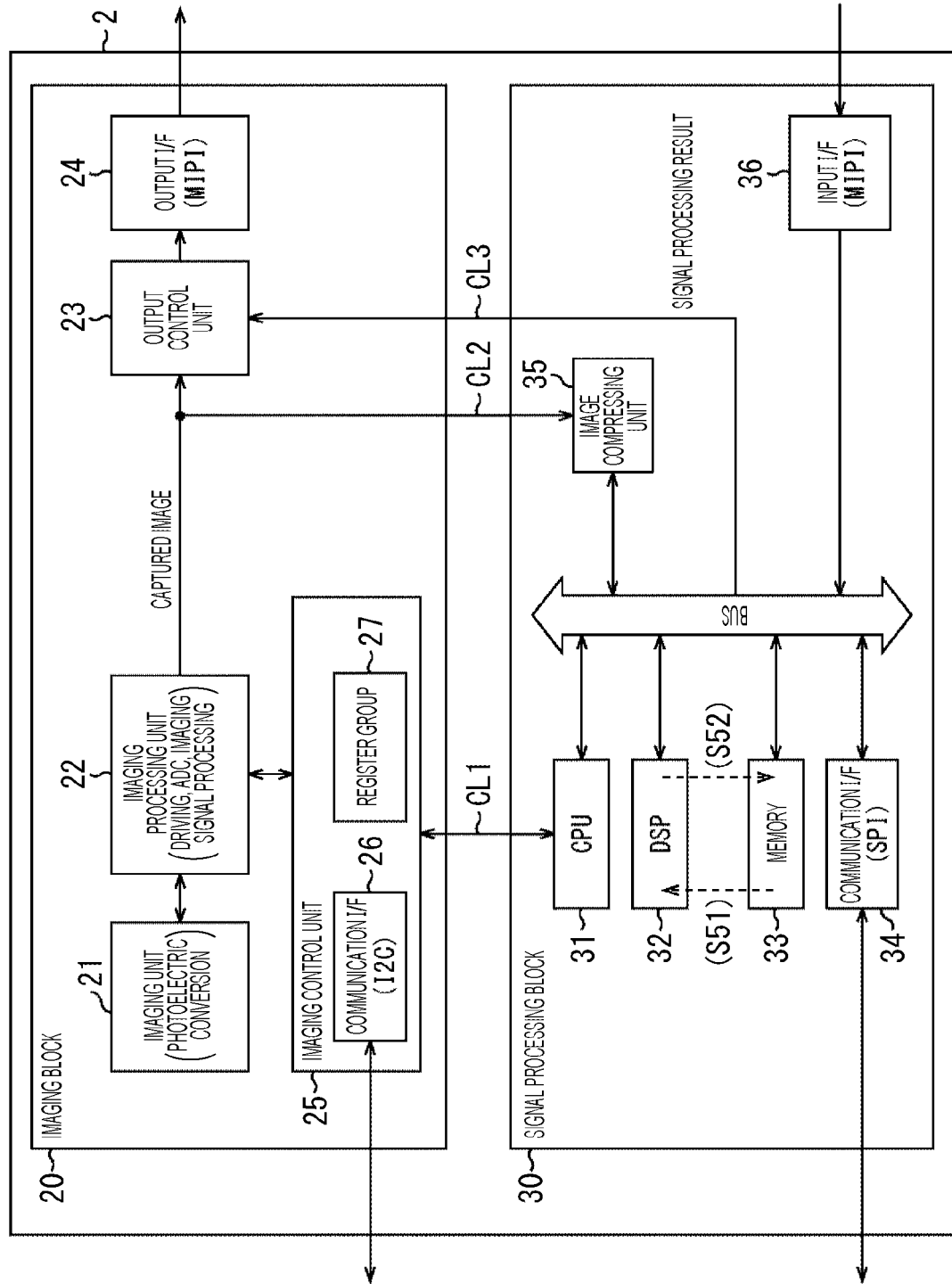
FIG. 12 is a diagram describing an outline of a processing example of the imaging device 2 in a case where a fusion process is performed as signal processing of the DSP 32.
Figure 13:
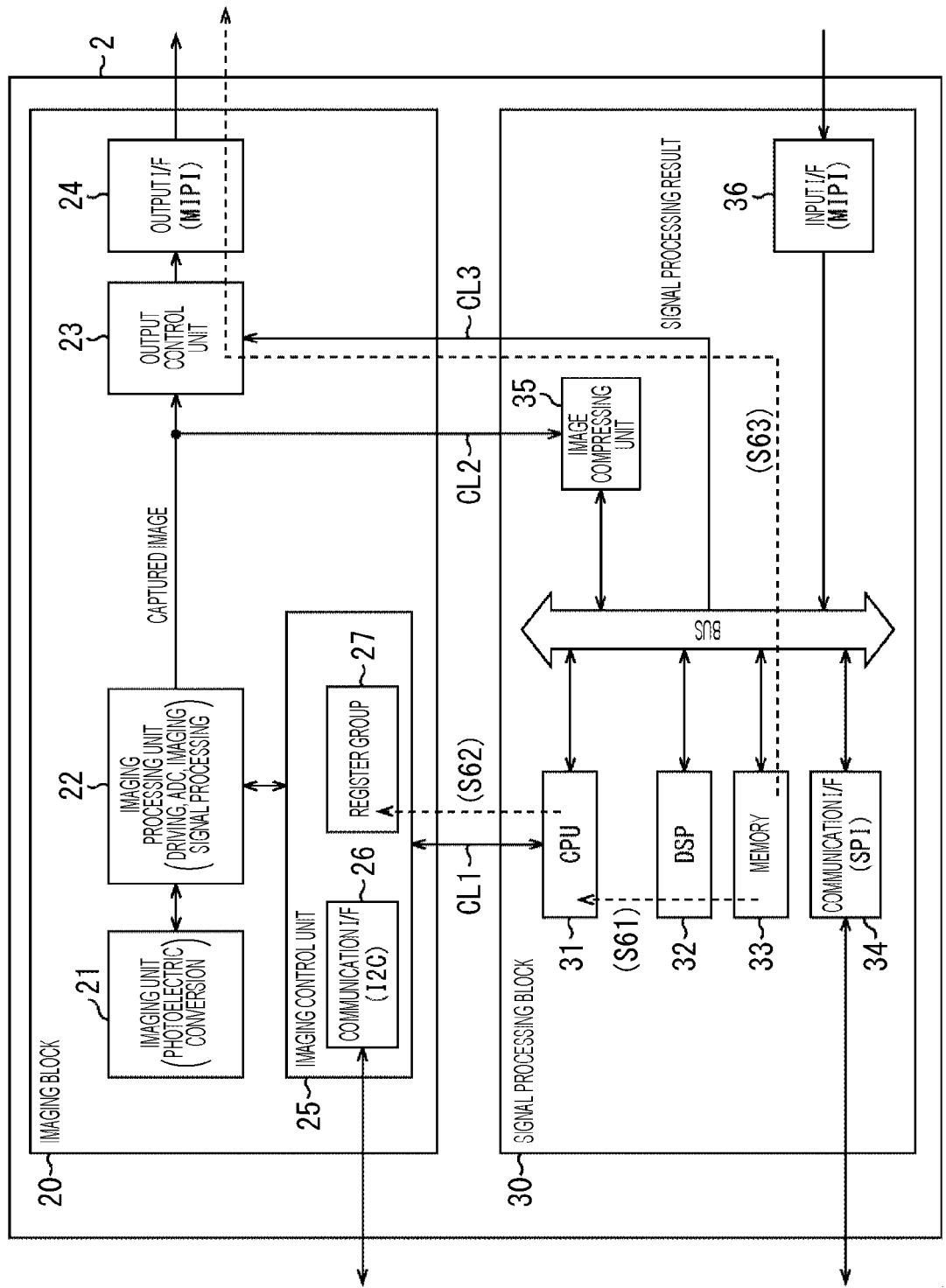
FIG. 13 is a diagram describing an outline of a processing example of the imaging device 2 in a case where a fusion process is performed as signal processing of the DSP 32.

FIGS. 11, 12, and 13 are diagrams illustrating an outline of a processing example of the imaging device 2 in a case where the fusion process is performed as signal processing of the DSP 32.

In Step S41 of FIG. 11, the communication I/F 34 downloads a program which is executed by the CPU 31 and the DSP 32 from the outside and stores the program in the memory 33 in performing the fusion process as the signal processing of the DSP 32. Here, the program which is executed by the DSP 32 is a fusion processing program for performing a fusion process as the signal processing.

The CPU 31 starts a predetermined process by executing a program stored in the memory 33.

That is, in Step S42, the CPU 31 reads (information of) brightness for each sub area of a captured image and other necessary information from the register group 27 via the connection line CL1.

In Step S43, the CPU 31 performs control associated with the compression process such as determining a reduction rate indicating a degree of scaling-down of a captured image as the compression process in the image compressing unit 35.

In Step S44, the imaging unit 21 starts capturing of an image, and the imaging processing unit 22 starts outputting of a captured image from the imaging unit 21. Accordingly, supply of a captured image from the imaging processing unit 22 to the output control unit 23 and supply of the captured image from the imaging processing unit 22 to the image compressing unit 35 via the connection line CL2 are started.

The captured image supplied from the imaging processing unit 22 to the output control unit 23 is selected by the output control unit 23 if necessary and is output from the output I/F 24 to the outside.

In Step S45, the image compressing unit 35 starts a compression process of a captured image supplied from the imaging processing unit 22 via the connection line CL2.

The image compressing unit 35 stores the monochrome captured image of a VGA size acquired as the result of the compression result as a compressed image in the memory 33.

In a case where the fusion process is performed as the signal processing, a sensor output of a range sensor, for example, a ToF sensor (not illustrated) installed to satisfy a predetermined positional relationship with the imaging device 2, is supplied to the input I/F 36 from the ToF sensor.

Here, the sensor output of the ToF sensor has a form of an image having, for example, a sensing result of a distance (for example, a value corresponding to the time until light emitted from the ToF sensor is reflected from a subject and is received by the ToF sensor or the like) as a pixel value. Hereinafter, this image is also referred to as a ToF image. The ToF image is, for example, an image of a QQVGA size or a QVGA size.

In Step S46, the input I/F 36 starts receiving the ToF image as the sensor output of the ToF sensor. The ToF image received by the input I/F 36 is supplied to the memory 33 and stored therein.

In Step S51 of FIG. 12, the DSP 32 starts a fusion process as signal processing corresponding to a fusion processing program by reading and executing the fusion processing program stored in the memory 33 in Step S41.

That is, the DSP 32 sequentially reads areas of a compressed image stored in the memory 33 as a fusion process target from the memory 33, reads the ToF image from the memory 33, and performs a fusion process using the processing target of the compressed image and the ToF image.

In the fusion process, for example, the sensor output which is pixel values of the ToF image is converted into a value indicating a distance, and a range image with the value indicating the distance as pixel values is generated. In this embodiment, for example, one range image is acquired from four continuous ToF images.

Furthermore, in the fusion process, calibration of aligning the pixels of (the processing target of) the compressed image and the corresponding pixels of the range image is performed, for example, on the basis of the positional relationship between the imaging device 2 and the ToF sensor.

Further, in the fusion process, noise of the range image is removed, for example, by referring to the texture or the like of the compressed images and performing correction or the like of matching values indicating a distance as pixel values of a plurality of pixels of a range image corresponding to a plurality of pixels in the compressed images in which a subject at an equidistance appears.

In Step S52, the DSP 32 supplies the result of the fusion process as a signal processing result to the memory 33 and stores the result of the fusion process therein. The result of the fusion process is, for example, a range image from which noise has been removed.

Incidentally, in the fusion process, gradation conversion of the compressed image such as setting average brightness of the compressed image to a predetermined fixed value can be performed in order to prevent luminance of a compressed image (a captured image) from affecting removal of noise of the range image. This gradation conversion can be performed using brightness for each sub area of the captured image which is read from the register group 27 by the CPU 31 in Step S42 of FIG. 11.

In Step S61 of FIG. 13, the CPU 31 reads a range image as a signal processing result stored in the memory 33 and performs an operation of calculating imaging information such as focusing suitable for capturing a captured image using the range image.

For example, the CPU 31 detects a closest subject or a subject distant at a predetermined distance from the range image and calculates imaging information for controlling automatic focusing to set a focus on the detected subject. Further, for example, the CPU 31 detects a closest subject or a subject distant at a predetermined distance from the range image and calculates an exposure time suitable for imaging the detected subject according to the luminance or the like of the subject.

In addition, the CPU 31 calculates imaging information such as a frame rate, an imaging mode, and a cutting area suitable for capturing a captured image using the range image if necessary.

In Step S62, the CPU 31 feeds back the imaging information calculated in Step S61 to the register group 27 via the connection line CL1. The register group 27 newly stores the imaging information fed back from the CPU 31 and then the imaging control unit 25 controls the imaging processing unit 22 on the basis of the imaging information newly stored in the register group 27.

In Step S63, the CPU 31 reads the range image as the signal processing result stored in the memory 33 and supplies the range image to the output control unit 23.

The range image as the signal processing result supplied from the memory 33 to the output control unit 23 is selected by the output control unit 23 if necessary and is output from the output I/F 24 to the outside.

Figure 14:
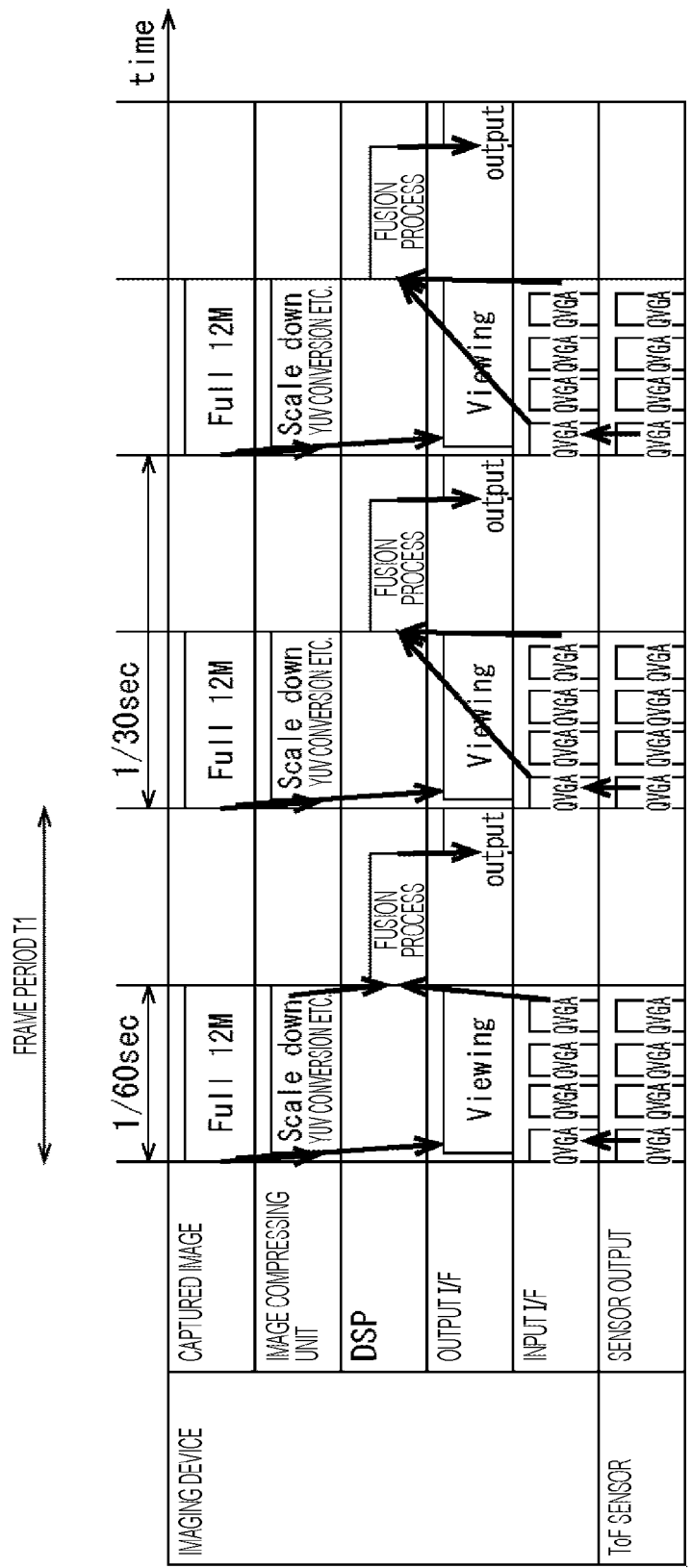
FIG. 14 is a timing diagram describing a first example of a processing time of the imaging device 2 in a case where a fusion process is performed as signal processing of the DSP 32.

FIG. 14 is a timing diagram describing a first example of a processing time of the imaging device 2 in a case where a fusion process is performed as signal processing of the DSP 32.

For example, the imaging unit 21 captures a color captured image of 12M pixels for 1/60 seconds in the first half of a frame period T1 with 1/30 seconds as the frame period T1. A captured image acquired through imaging of the imaging unit 21 is supplied from the imaging processing unit 22 to the output control unit 23 and the image compressing unit 35.

When the captured image is supplied from the imaging processing unit 22, the output control unit 23 selects the captured image and outputs the selected captured image from the output I/F 24 to the outside.

In the image compressing unit 35, scale-down and YUV conversion are performed as the compression process of the color captured image of 12M pixels, and the color captured image of 12M pixels is converted into a monochrome compressed image of a VGA size. This compressed image is stored in the memory 33.

In FIG. 14, a ToF sensor is connected to the input I/F 36 of the imaging device 2, and the ToF sensor outputs a ToF image of a QVGA size as a sensor output.

The input I/F 36 receives the ToF image as the sensor output of the ToF sensor and stores the ToF image in the memory 33.

Here, in FIG. 14, the ToF sensor can output a ToF image of a QVGA size at 240 fps (frames per second). In FIG. 14, the ToF sensor outputs only four ToF images of a QVGA size at 240 fps for 1/60 seconds in the first half of the frame period T1, and the input I/F 36 receives the four ToF images for 1/60 seconds in the first half of the frame period T1.

In FIG. 14, the compression process of the captured image in the noticed frame period T1 (captured for 1/60 seconds in the first half) ends in the first half of the noticed frame period T1. Furthermore, in the first half of the noticed frame period T1, receiving of four ToF images by the input I/F 36 ends.

Thereafter, at a time at which 1/60 seconds in the second half of the noticed frame period T1 starts, the DSP 32 starts the fusion process using the compressed image stored in the memory 33, that is, the compressed image acquired from the captured image in the noticed frame period T1, and the four ToF images stored in the memory 33.

In the fusion process, for example, one range image in the noticed frame period T1 is generated from the four ToF images in the noticed frame period T1, and calibration of aligning the pixels of the compressed image and the pixels of the range image is performed. Then, noise of the range image is removed using the compressed image.

Here, in FIG. 14, the frame rate of the ToF images is 240 fps, and the frame rate of the range image is 30 fps corresponding to the frame period T1 (1/30 seconds).

At a time slightly before the noticed frame period T1 ends, the DSP 32 ends the fusion process using the compressed image acquired from the captured image in the noticed frame period T1 and supplies the range image from which noise has been removed and which has been acquired as the result of the fusion process as a signal processing result to the output control unit 23.

When the range image as a signal processing result is supplied, the output control unit 23 selects the signal processing result and outputs the signal processing result from the output I/F 24 to the outside.

In FIG. 14, the signal processing result in the noticed frame period T1, that is, the signal processing result (the range image) of the fusion process using the compressed image acquired from the captured image in the noticed frame period T1, is output from the output I/F 24 in a period from a time immediately before the noticed frame period T1 ends to the time at which the noticed frame period T1 ends.

Figure 15:
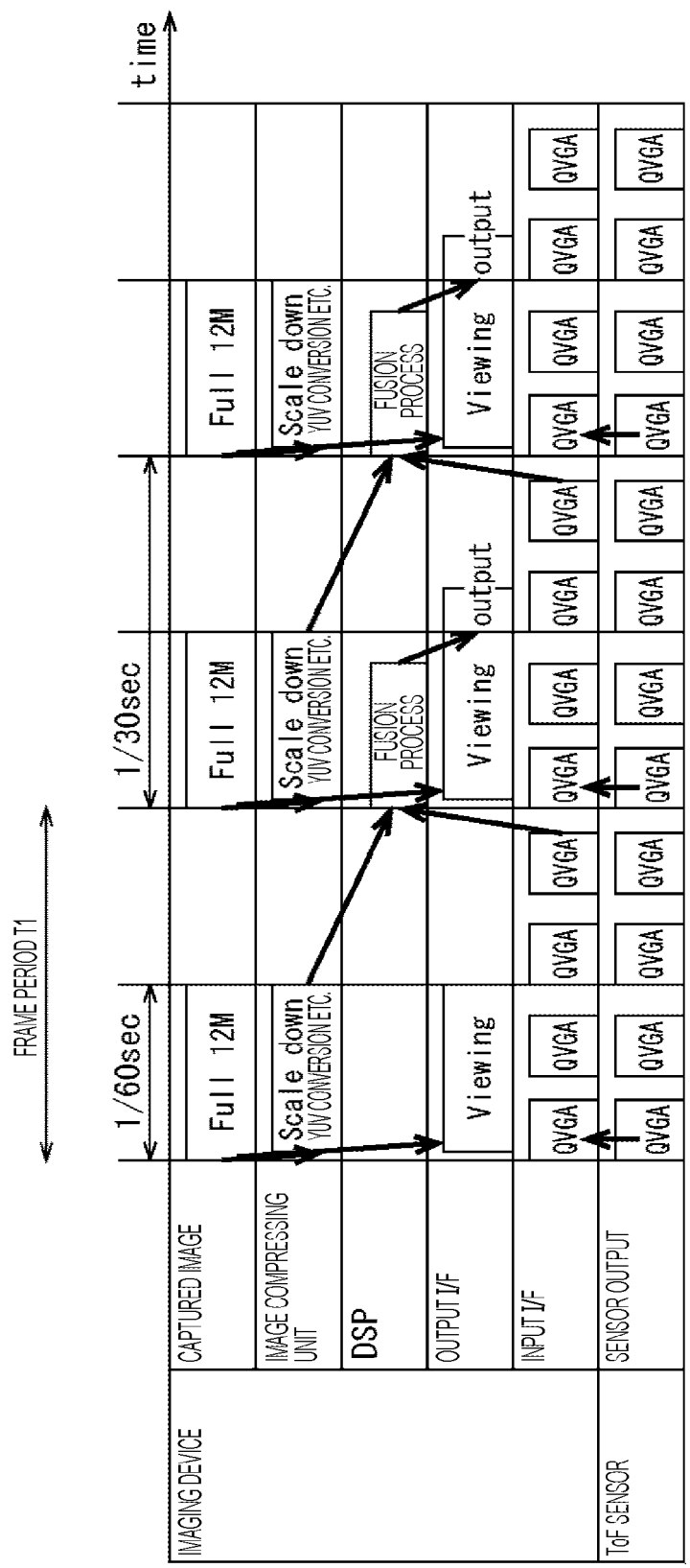
FIG. 15 is a timing diagram describing a second example of a processing time of the imaging device 2 in a case where a fusion process is performed as signal processing of the DSP 32.

FIG. 15 is a timing diagram describing a second example of a processing time of the imaging device 2 in a case where a fusion process is performed as signal processing of the DSP 32.

In FIG. 15, similarly to FIG. 14, the imaging unit 21 captures a color captured image of 12M pixels for 1/60 seconds in the first half of a frame period T1 with 1/30 seconds as the frame period T1 and the captured image is output from the output I/F 24 to the outside.

Furthermore, in FIG. 15, similarly to FIG. 14, the image compressing unit 35 generates a monochrome compressed image of a VGA size by scale-down and YUV conversion as the compression process of the color captured image of 12M pixels, and stores the generated monochrome compressed image in the memory 33.

Further, in FIG. 15, similarly to FIG. 14, a ToF sensor is connected to the input I/F 36 of the imaging device 2, and the ToF sensor outputs a ToF image of a QVGA size as a sensor output.

Here, in FIG. 15, the ToF sensor outputs a ToF image of a QVGA size at 120 fps. Accordingly, in FIG. 15, the time required for the ToF sensor to output four ToF images required for generating one range image is 1/30 seconds=1/120×4 seconds, that is, equal to the frame period T1.

The input I/F 36 receives the ToF images as the sensor output of the ToF sensor and stores the ToF images in the memory 33.

That is, in FIG. 15, since the ToF sensor outputs four ToF images of a QVGA size at 120 fps in the frame period T1 as described above, the input I/F 36 receives the four ToF images in the frame period T1.

Accordingly, in receiving of the ToF images which is started at the start of the noticed frame period T1, receiving of four ToF images required for generating a range image is completed (almost) at the end of the noticed frame period T1.

Accordingly, it is difficult to complete the fusion process using the compressed image acquired from the captured image in the noticed frame period T1 and four ToF images received from the ToF sensor in the noticed frame period T1 within the noticed frame period T1.

Therefore, in FIG. 15, the DSP 32 starts the fusion process using the compressed image acquired from the captured image in the noticed frame period T1 and four ToF images received from the ToF sensor in the noticed frame period T1 at the start time of a next frame period T1 of the noticed frame period T1.

Hereinafter, the compressed image acquired from the captured image in the noticed frame period T1 is also referred to as a compressed image of the noticed frame period T1, and (four) ToF images received from the ToF sensor in the noticed frame period T1 is also referred to as (four) ToF images of the noticed frame period T1.

The DSP 32 starts the fusion process using the compressed image of the noticed frame period T1 and four ToF images of the noticed frame period T1 at the start time of the next frame period T1 of the noticed frame period T1, and ends the fusion process at a time slightly before the first half of the next frame period T1 of the noticed frame period T1 ends.

Then, the DSP 32 supplies the range image from which noise has been removed and which has been acquired as the result of the fusion process as a signal processing result to the output control unit 23.

Here, the signal processing result of the fusion process using the compressed image of the noticed frame period T1 and four ToF images of the noticed frame period T1 and the range image as the signal processing result are also referred to as a signal processing result of the noticed frame period T1 and the range image of the noticed frame period T1.

After outputting of the captured image in the next frame period T1 of the noticed frame period T1 from the output I/F 24 has ended, the output control unit 23 selects the range image as the signal processing result of the noticed frame period T1 and outputs the selected range image from the output I/F 24 to the outside.

Accordingly, in FIG. 15, similarly to FIG. 14, the frame rate of the distance image is 30 fps which corresponds to the frame period T1 (1/30 seconds), and the range image as the signal processing result of the noticed frame period T1 is not output in the noticed frame period T1 but is output in the next frame period T1.

In FIG. 14, the range image as the signal processing result of the noticed frame period T1 is output in the noticed frame period T1. On the other hand, in FIG. 15, the range image as the signal processing result of the noticed frame period T1 is output in the next frame period T1 of the noticed frame period T1. Accordingly, in FIG. 15, a ToF sensor in which the frame rate of a ToF image is lower than that in the case of FIG. 14, that is, a low-cost ToF sensor, can be used as the ToF sensor connected to the input I/F 36.

Incidentally, as described above with reference to FIGS. 11 to 15, a form of use of the imaging device 2 in which a sensor output of a range sensor such as a ToF sensor is received from the input I/F 36 and the fusion process is performed can be applied, for example, to automatic driving of a vehicle and the like.

<Processing Example of Imaging Device 2 in Case where SLAM Process is Performed as Signal Processing in DSP 32>

Figure 16:
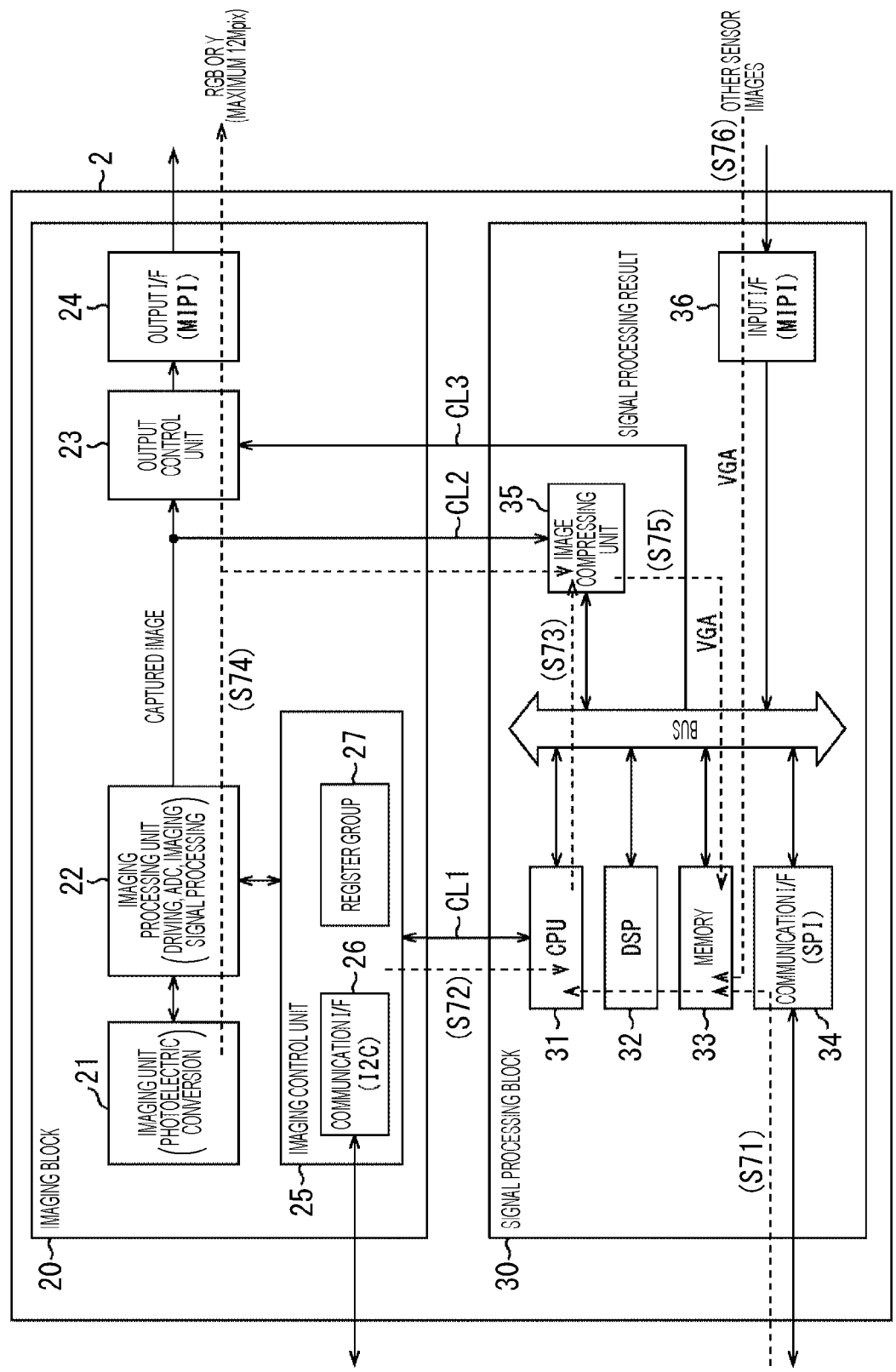
FIG. 16 is a diagram describing an outline of a processing example of the imaging device 2 in a case where an SLAM process is performed as signal processing of the DSP 32.
Figure 17:
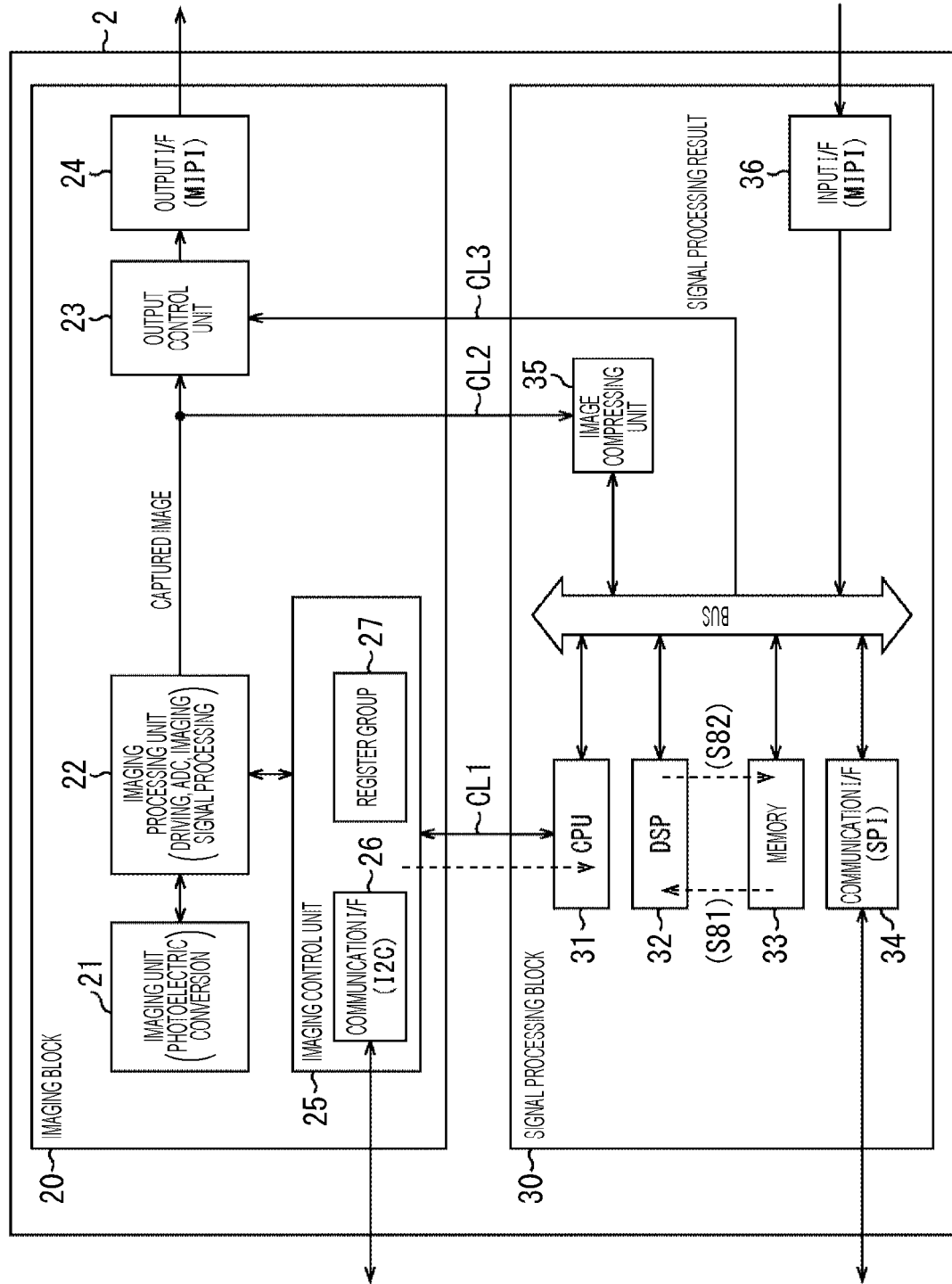
FIG. 17 is a diagram describing an outline of a processing example of the imaging device 2 in a case where an SLAM process is performed as signal processing of the DSP 32.
Figure 18:
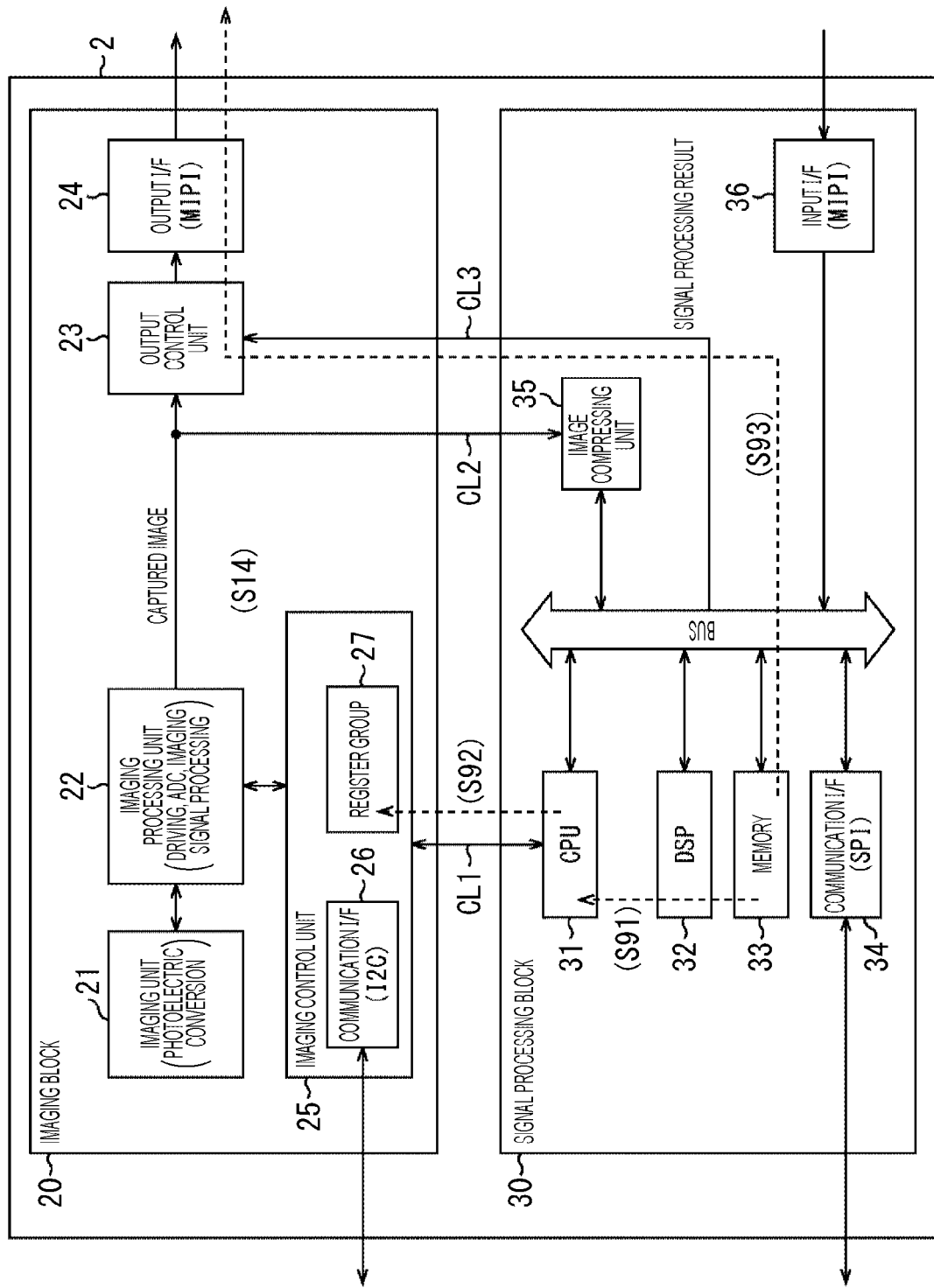
FIG. 18 is a diagram describing an outline of a processing example of the imaging device 2 in a case where an SLAM process is performed as signal processing of the DSP 32.

FIGS. 16, 17, and 18 are diagrams illustrating an outline of a processing example of the imaging device 2 in a case where the SLAM process is performed as signal processing of the DSP 32.

In Step S71 of FIG. 16, the communication I/F 34 downloads a program which is executed by the CPU 31 and the DSP 32 from the outside and stores the program in the memory 33 in performing the SLAM process as the signal processing of the DSP 32. Here, the program which is executed by the DSP 32 is an SLAM processing program for performing an SLAM process as the signal processing.

The CPU 31 starts a predetermined process by executing a program stored in the memory 33.

That is, in Step S72, the CPU 31 reads (information of) brightness for each sub area of a captured image and other necessary information from the register group 27 via the connection line CL1.

In Step S73, the CPU 31 performs control associated with the compression process such as determining a reduction rate indicating a degree of scaling-down of a captured image as the compression process in the image compressing unit 35.

In Step S74, the imaging unit 21 starts capturing of an image, and the imaging processing unit 22 starts outputting of a captured image from the imaging unit 21. Accordingly, supply of a captured image from the imaging processing unit 22 to the output control unit 23 and supply of the captured image from the imaging processing unit 22 to the image compressing unit 35 via the connection line CL2 are started.

The captured image supplied from the imaging processing unit 22 to the output control unit 23 is selected by the output control unit 23 if necessary and is output from the output I/F 24 to the outside.

In Step S75, the image compressing unit 35 starts a compression process of a captured image supplied from the imaging processing unit 22 via the connection line CL2.

The image compressing unit 35 stores the monochrome captured image of a VGA size acquired as the result of the compression result as a compressed image in the memory 33.

In a case where the SLAM process is performed as the signal processing, a sensor output of an image sensor (not illustrated) installed to satisfy a predetermined positional relationship with the imaging device 2, is supplied to the input I/F 36 from the image sensor.

Hereinafter, the image sensor which is installed to satisfy a predetermined positioning relationship with the imaging device 2 and which is different from the imaging device 2 is also referred to as other sensor. Furthermore, the other sensor senses light and outputs an image corresponding to the light as a sensor output, and the image as the sensor output of the other sensor is also referred to as other sensor image. Here, it is assumed that the other sensor image is, for example, an image of a VGA size.

In Step S76, the input I/F 36 starts receiving the other sensor image of a VGA size as the sensor output of the other sensor. The other sensor image of a VGA size received by the input I/F 36 is supplied to the memory 33 and stored therein.

In Step S81 of FIG. 17, the DSP 32 starts an SLAM process as signal processing corresponding to an SLAM processing program by reading and executing the SLAM processing program stored in the memory 33 in Step S71.

That is, the DSP 32 sequentially reads areas of a compressed image stored in the memory 33 as a processing target of the SLAM process from the memory 33, reads the other sensor image from the memory 33, and performs the SLAM process using the processing target of the compressed image and the other sensor image as stereoscopic images.

In the SLAM process, rectification of aligning the compressed image and the other sensor image to be in parallel to each other (horizontally equating the imaging device 2 and the other sensor) is performed, for example, on the basis of the positional relationship between the imaging device 2 and the other sensor.

In addition, in the SLAM process, self-localization and construction (development) of a map are performed, for example, using the compressed image and the other sensor image as stereoscopic images having been subjected to the rectification.

In Step S82, the DSP 32 supplies the result of the SLAM process as a signal processing result to the memory 33 and stores the result of the SLAM process therein. The result of the SLAM process is, for example, a localization result of self-localization (hereinafter also referred to as a localization result) and a map constructed along with the self-localization.

Incidentally, in the SLAM process, gradation conversion of the compressed image and the other sensor image such as setting average brightness of the compressed image and the other sensor image to a predetermined fixed value can be performed in order to prevent luminance of the compressed image (a captured image) and the other sensor image from affecting self-localization or construction of a map. This gradation conversion can be performed using brightness for each sub area of the captured image which is read from the register group 27 by the CPU 31 in Step S72 of FIG. 16.

In Step S91 of FIG. 18, the CPU 31 reads the localization result and the map as a signal processing result stored in the memory 33 and performs an operation of calculating imaging information such as an exposure time, focusing, a frame rate, an imaging mode, and a cutting area suitable for capturing a captured image using the localization result and the map, if necessary.

In Step S92, the CPU 31 feeds back the imaging information calculated in Step S91 to the register group 27 via the connection line CL1. The register group 27 newly stores the imaging information fed back from the CPU 31 and then the imaging control unit 25 controls the imaging processing unit 22 on the basis of the imaging information newly stored in the register group 27.

In Step S93, the CPU 31 reads the localization result and the map as the signal processing result stored in the memory 33 and supplies the range image to the output control unit 23.

The localization result and the map as the signal processing result supplied from the memory 33 to the output control unit 23 are selected by the output control unit 23 and are output from the output I/F 24 to the outside.

Figure 19:
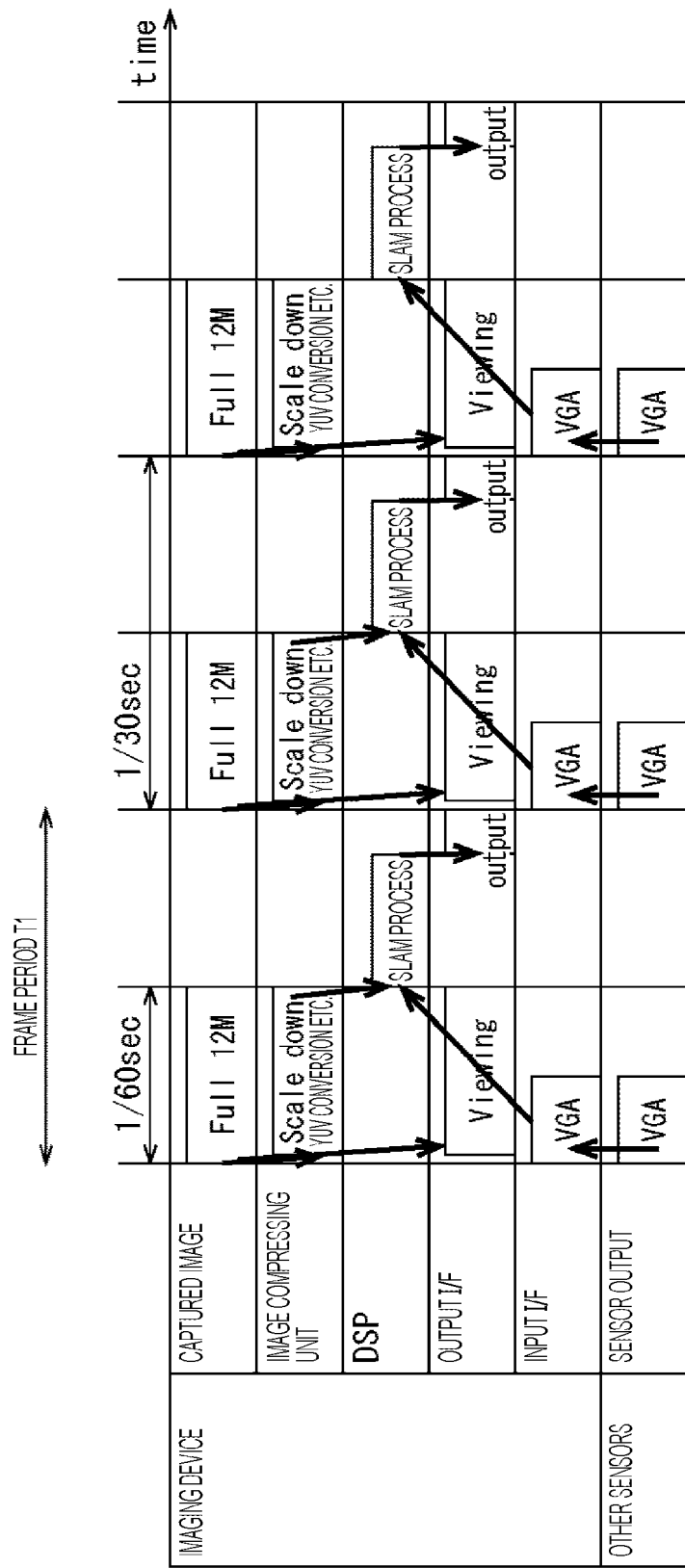
FIG. 19 is a timing diagram describing a first example of a processing time of the imaging device 2 in a case where an SLAM process is performed as signal processing of the DSP 32.

FIG. 19 is a timing diagram describing a first example of a processing time of the imaging device 2 in a case where an SLAM process is performed as signal processing of the DSP 32.

For example, the imaging unit 21 captures a color captured image of 12M pixels for 1/60 seconds in the first half of a frame period T1 with 1/30 seconds as the frame period T1. A captured image acquired through imaging of the imaging unit 21 is supplied from the imaging processing unit 22 to the output control unit 23 and the image compressing unit 35.

When the captured image is supplied from the imaging processing unit 22, the output control unit 23 selects the captured image and outputs the selected captured image from the output I/F 24 to the outside.

In the image compressing unit 35, scale-down and YUV conversion are performed as the compression process of the color captured image of 12M pixels, and the color captured image of 12M pixels is converted into a monochrome compressed image of a VGA size. This compressed image is stored in the memory 33.

In FIG. 19, another sensor is connected to the input I/F 36 of the imaging device 2, and the other sensor outputs the other sensor image of a VGA size as a sensor output.

The input I/F 36 receives the other sensor image as the sensor output of the other sensor and stores the other sensor image in the memory 33.

Here, in FIG. 19, the other sensor outputs the other sensor image of a VGA size at 30 fps which is the same as the frame period T1. That is, in FIG. 19, the other sensor outputs the other sensor image of a VGA size at 30 fps in synchronization with the imaging device 2 at the time of start of the frame period T1. The input I/F 36 receives the other sensor image.

In FIG. 19, the compression process of the captured image in the noticed frame period T1 ends in the first half of the noticed frame period T1.

Thereafter, at a time at which 1/60 seconds in the second half of the noticed frame period T1 starts, the DSP 32 starts the SLAM process using the compressed image acquired from the captured image in the noticed frame period T1 stored in the memory 33 and the other sensor image in the noticed frame period T1 stored in the memory 33.

In the SLAM process, for example, rectification of a compressed image (of a captured image) in the noticed frame period T1 and the other sensor image in the noticed frame period T1 is performed and self-localization and construction of a map in the noticed frame period T1 are performed using the compressed image and the other sensor image having been subjected to the rectification.

At a time slightly before the noticed frame period T1 ends, the DSP 32 ends the SLAM process using the compressed image and the other sensor image in the noticed frame period T1 and supplies the localization result and the map which have been acquired as the result of the SLAM process as a signal processing result to the output control unit 23.

When the localization result and the map as a signal processing result are supplied, the output control unit 23 selects the signal processing result and outputs the signal processing result from the output I/F 24 to the outside.

In FIG. 19, the signal processing result in the noticed frame period T1, that is, the signal processing result (the localization result and the map) of the SLAM process using the compressed image and the other sensor image in the noticed frame period T1, is output from the output I/F 24 in a period from the time immediately before the noticed frame period T1 ends to the time at which the noticed frame period T1 ends.

Figure 20:
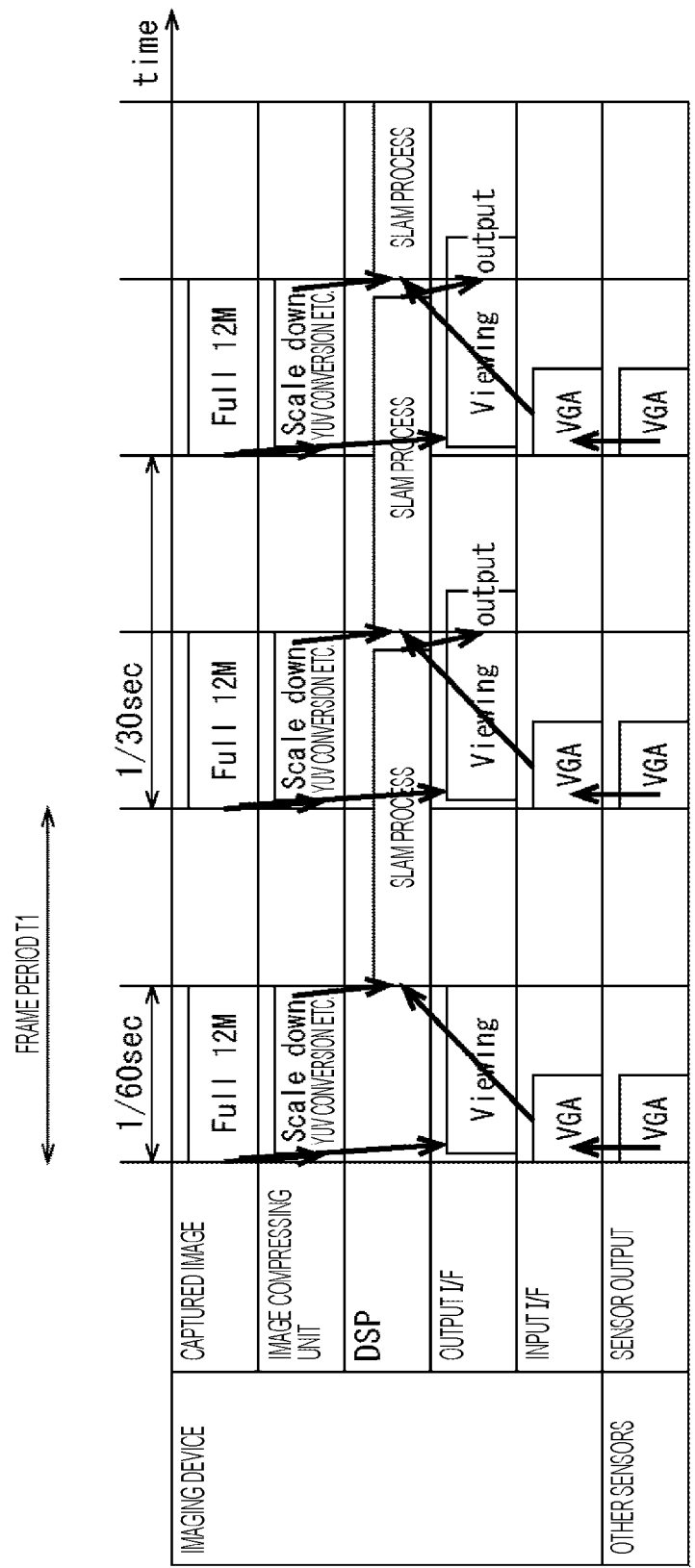
FIG. 20 is a timing diagram describing a second example of a processing time of the imaging device 2 in a case where an SLAM process is performed as signal processing of the DSP 32.

FIG. 20 is a timing diagram describing a second example of a processing time of the imaging device 2 in a case where an SLAM process is performed as signal processing of the DSP 32.

In FIG. 20, similarly to FIG. 19, the imaging unit 21 captures a color captured image of 12M pixels with 1/30 seconds as a frame period T1 and outputs the color captured image from the output I/F 24 to the outside.

Furthermore, in FIG. 20, similarly to FIG. 19, the image compressing unit 35 generates a monochrome compressed image of a VGA size by performing scale-down and YUV conversion as the compression process of the color captured image of 12M pixels, and stores the color captured image of 12M pixels in the memory 33.

Further, in FIG. 20, similarly to FIG. 19, another sensor is connected to the input I/F 36 of the imaging device 2, and the other sensor outputs the other sensor image of a VGA size as a sensor output.

Similarly to FIG. 19, the input I/F 36 receives the other sensor image as the sensor output of the other sensor and stores the other sensor image in the memory 33.

In FIG. 20, similarly to FIG. 19, the compression process of the captured image in the noticed frame period T1 ends in the first half of the noticed frame period T1.

Thereafter, at a time at which 1/60 seconds in the second half of the noticed frame period T1 starts, the DSP 32 starts the SLAM process using the compressed image acquired from the captured image in the noticed frame period T1 stored in the memory 33 and the other sensor image in the noticed frame period T1 stored in the memory 33.

In the SLAM process, for example, rectification of a compressed image in the noticed frame period T1 and the other sensor image in the noticed frame period T1 is performed and self-localization and construction of a map in the noticed frame period T1 are performed using the compressed image and the other sensor image having been subjected to the rectification.

In FIG. 20, at a time slightly before the first half of a next frame period T1 of the noticed frame period T1 ends, the DSP 32 ends the SLAM process using the compressed image and the other sensor image in the noticed frame period T1 and supplies the localization result and the map which have been acquired as the result of the SLAM process as a signal processing result to the output control unit 23.

After outputting of the captured image in the next frame period T1 of the noticed frame period T1 from the output I/F 24 has ended, the output control unit 23 selects the localization result and the map as the signal processing result in the noticed frame period T1 and outputs the localization result and the map from the output I/F 24 to the outside.

Accordingly, in FIG. 20, the localization result and the map as the signal processing result in the noticed frame period T1 are not output in the noticed frame period T1 but are output in the next frame period T1.

The localization result and the map as the signal processing result in the noticed frame period T1 are output in the noticed frame period T1 in FIG. 19, but the localization result and the map as the signal processing result in the noticed frame period T1 are output in the next frame period T1 of the noticed frame period T1 in FIG. 20. Accordingly, in FIG. 20, a longer time can be assigned to the SRAM process in comparison with the case illustrated in FIG. 19. As a result, it is possible to improve accuracy of the localization result and the map as the signal processing result of the SRAM process.

Figure 21:
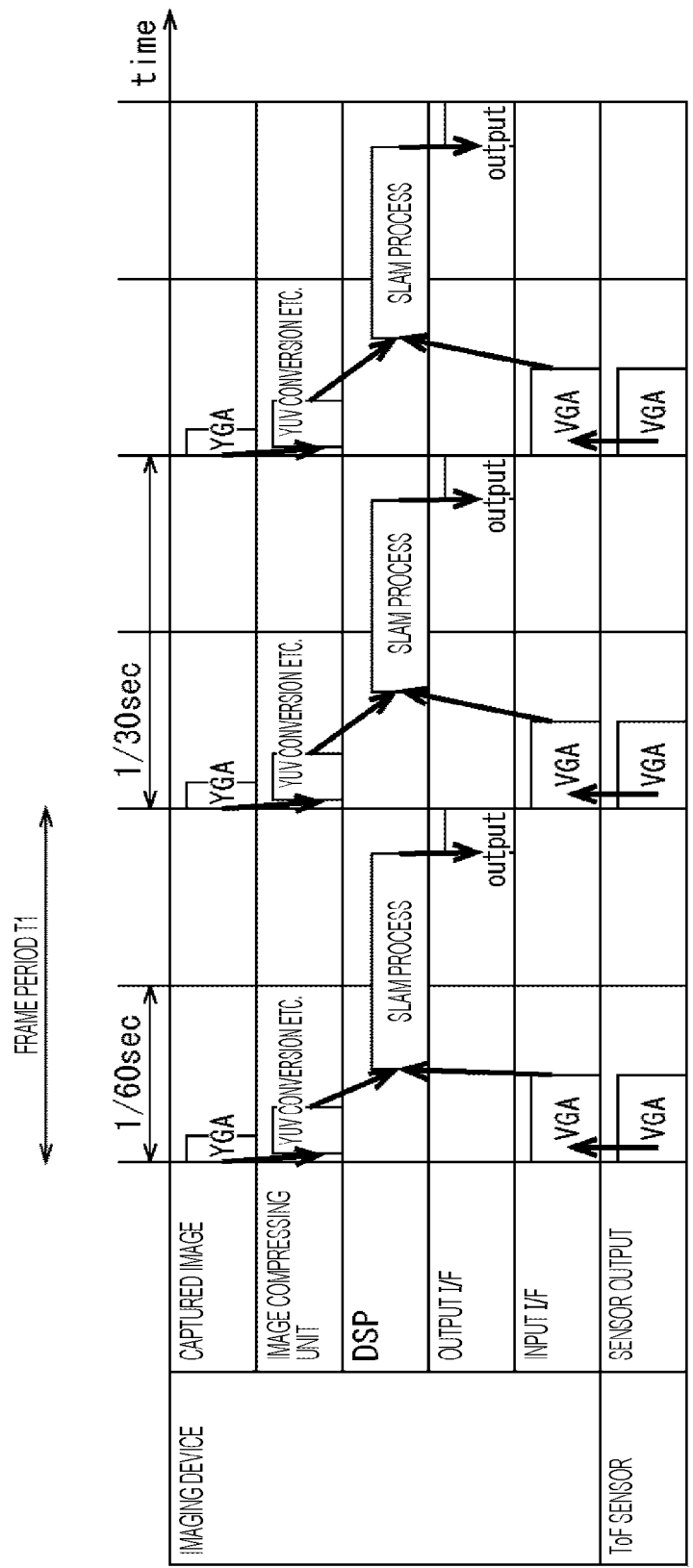
FIG. 21 is a timing diagram describing a third example of a processing time of the imaging device 2 in a case where an SLAM process is performed as signal processing of the DSP 32.

FIG. 21 is a timing diagram describing a third example of a processing time of the imaging device 2 in a case where an SLAM process is performed as signal processing of the DSP 32.

In FIG. 21, the imaging unit 21 captures an image of one frame with 1/30 seconds as a frame period T1. Here, in FIG. 21, the imaging unit 21 captures a color captured image of a VGA size, not a color captured image of 12M pixels. Accordingly, in FIG. 21, capturing of an image in one frame ends for a very short time from start of the frame period T1. The captured image captured by the imaging unit 21 is supplied from the imaging processing unit 22 to the output control unit 23 and the image compressing unit 35.

Here, in FIG. 21, a captured image is not used in the outside, and thus the output control unit 23 does not select the captured image and does not output the captured image from the output I/F 24 to the outside even when the captured image is supplied from the imaging processing unit 22.

The image compressing unit 35 performs a compression process of the captured image and stores a compressed image acquired as a result in the memory 33.

Here, in FIG. 21, since the captured image is a color image of a VGA size, YUV conversion is performed but scale-down is not performed as the compression process. Accordingly, the compression process in FIG. 21 ends for a shorter time in comparison with a case where the captured image is a color image of 12M pixels.

In FIG. 21, similarly to FIG. 19 or 20, another sensor is connected to the input I/F 36 of the imaging device 2, and the other sensor outputs the other sensor image of a VGA size at 30 fps as a sensor output.

The input I/F 36 receives the other sensor image as the sensor output of the other sensor and stores the other sensor image in the memory 33.

In FIG. 21, when the other sensor image in the noticed frame period T1 is stored in the memory 33, the compression process of the captured image in the noticed frame period T1 ends, and the compressed image in the noticed frame period T1 acquired by the compression process is stored in the memory 33.

That is, when the other sensor image in the noticed frame period T1 is stored in the memory 33, both the compressed image and the other sensor image in the noticed frame period T1 are stored in the memory 33 and the SLAM process using the compressed image and the other sensor image can be started.

Thereafter, the DSP 32 starts the SLAM process using the compressed image and the other sensor image in the noticed frame period T1 stored in the memory 33 as stereoscopic images.

In the SLAM process, for example, rectification of a compressed image in the noticed frame period T1 and the other sensor image in the noticed frame period T1 is performed and self-localization and construction of a map in the noticed frame period T1 are performed using the compressed image and the other sensor image having been subjected to the rectification.

In FIG. 21, at a time slightly before the noticed frame period T1 ends, the DSP 32 ends the SLAM process using the compressed image and the other sensor image in the noticed frame period T1 and supplies the localization result and the map which have been acquired as the result of the SLAM process as a signal processing result to the output control unit 23.

When the localization result and the map as a signal processing result are supplied, the output control unit 23 selects the signal processing result and outputs the signal processing result from the output I/F 24 to the outside.

In FIG. 21, the signal processing result in the noticed frame period T1, that is, the signal processing result (the localization result and the map) of the SLAM process using the compressed image and the other sensor image in the noticed frame period T1, is output from the output I/F 24 in a period from the time immediately before the noticed frame period T1 ends to the time at which the noticed frame period T1 ends.

Furthermore, in FIG. 21, since the captured image output from the imaging unit 21 is an image of a VGA size, scale-down may not be performed in the compression process and thus it is possible to reduce a load of the compression process.

As described above, the embodiment in which the captured image output from the imaging unit 21 is not output as an image of a VGA size from the output I/F 24 is useful, for example, in a case where a captured image is not required by the outside and a signal processing result (herein the signal processing result of the SLAM process) is required.

Incidentally, as described above with reference to FIGS. 16 to 21, a form of use of the imaging device 2 in which the other sensor image is received from the input I/F 36 and the SLAM process is performed can be applied, for example, to robot which moves autonomously and the like.

Here, in a case where the input I/F 36 receives the other sensor image of the other sensor and the other sensor image and (a compressed image generated from) a captured image captured by the imaging device 2 are used as stereoscopic images, rectification is necessary.

In FIGS. 16 to 21, rectification is performed as a part of the SLAM process which is performed by causing the DSP 32 to execute an SLAM processing program, that is, rectification is performed in software, but necessary rectification cannot be performed in software but can be performed in dedicated hardware which is provided in the imaging device 2 in a case where the other sensor image and the captured image are used as stereoscopic images.

<Another Example of Configuration of Imaging Device 2>

Figure 22:
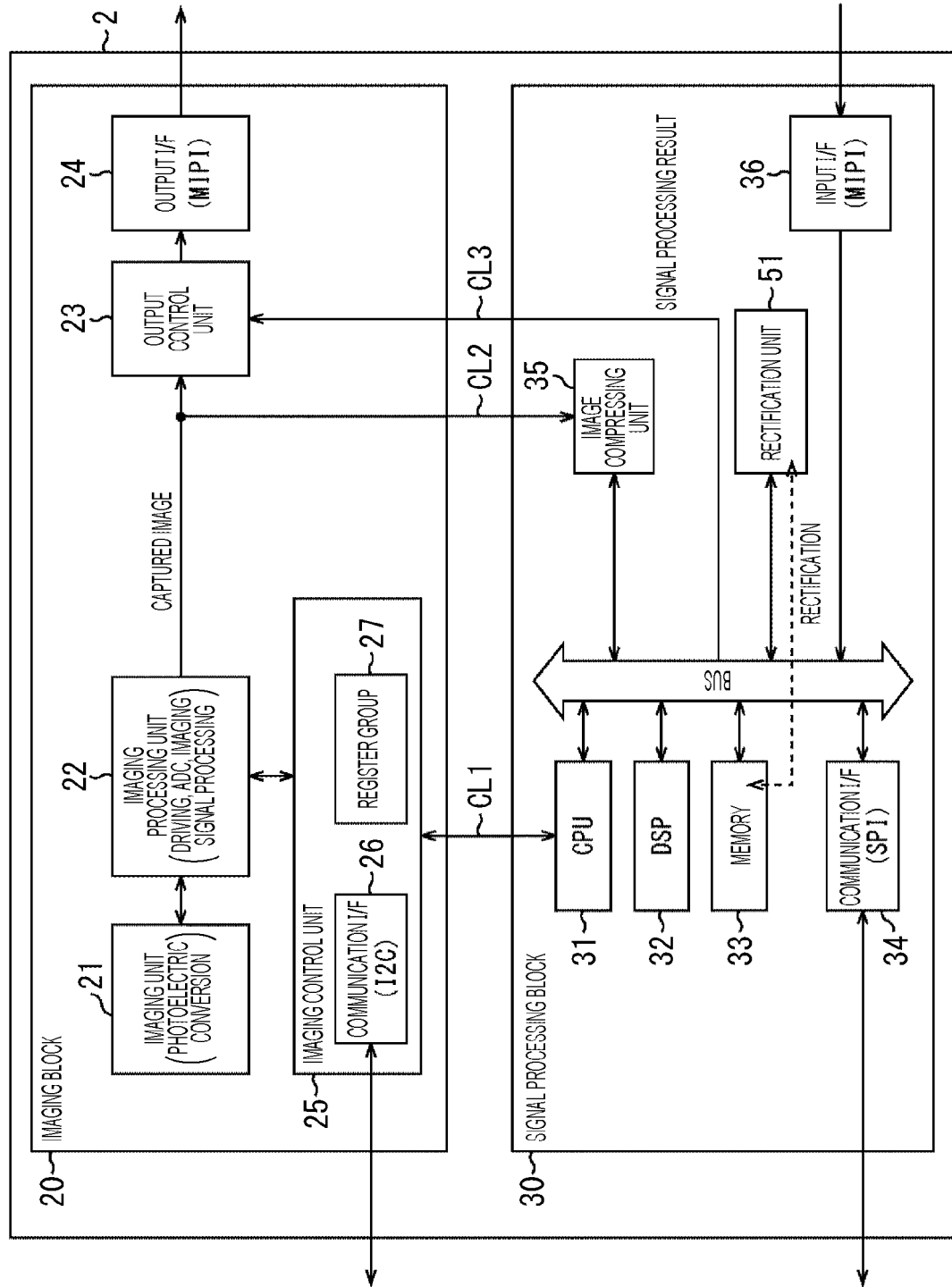
FIG. 22 is a block diagram illustrating another example of the configuration of the imaging device 2.

FIG. 22 is a block diagram illustrating another example of the configuration of the imaging device 2 illustrated in FIG. 1.

That is, FIG. 22 illustrates an example of a configuration of the imaging device 2 in which dedicated hardware for rectification is provided.

Incidentally, in the drawing, elements corresponding to those in FIG. 2 will be referred to by the same reference signs and description thereof will be omitted in the following description.

In FIG. 22, the imaging device 2 includes the imaging unit 21 to the imaging control unit 25, the CPU 31 to the input I/F 36, and a rectification unit 71.

Accordingly, the imaging device 2 illustrated in FIG. 22 is similar to that illustrated in FIG. 2, in that the imaging unit 21 to the imaging control unit 25 and the CPU 31 to the input I/F 36 are provided.

However, the imaging device 2 illustrated in FIG. 22 is different from that illustrated in FIG. 2, in that the rectification unit 71 is newly provided.

The rectification unit 71 is dedicated hardware for rectification and performs rectification on a compressed image and the other sensor image stored in the memory 33.

In FIG. 22, the DSP 32 performs an SLAM process using the compressed image and the other sensor image having been subjected to rectification by the rectification unit 71.

As described above, by providing the rectification unit 71 as dedicated hardware for rectification, it is possible to increase the speed of rectification.

<Example of Use of Imaging Device 2>

Figure 23:
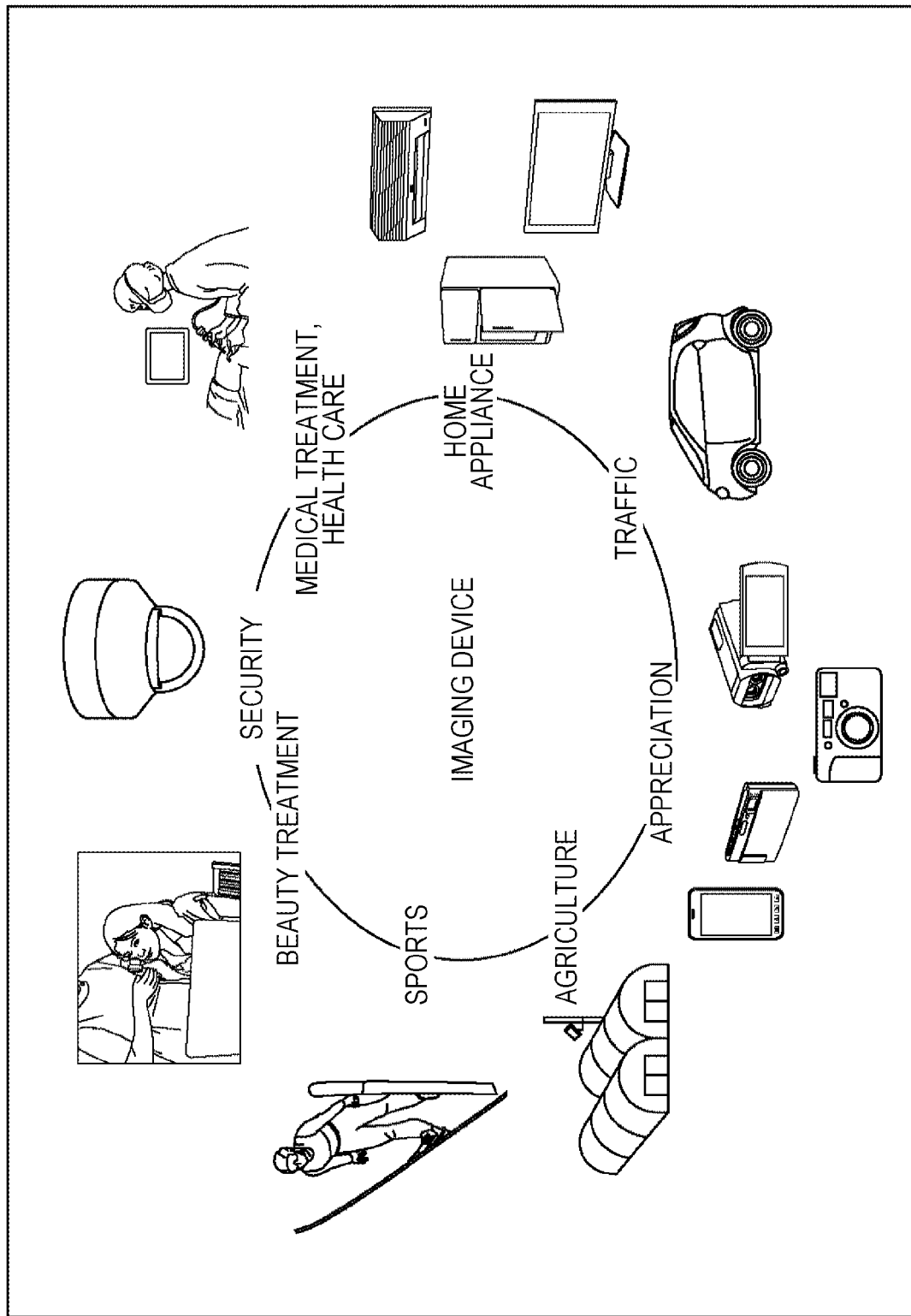
FIG. 23 is a diagram illustrating an example of use of the imaging device 2.

FIG. 23 is a diagram illustrating an example of use of the imaging device 2 illustrated in FIG. 1.

The imaging device 2 can be used, for example, for various electronic devices that sense light such as visible light, infrared light, ultraviolet light, and X-rays as will be described below.

An electronic device that captures an image which is provided for appreciation such as a digital camera or a portable device having a camera function An electronic device that is provided for traffic such as an onboard sensor that images the rear, the surroundings, the vehicle interior, and the like of a vehicle, a monitoring camera that monitors traveling vehicles or a road, and a distance sensor that measures an inter-vehicle distance or the like for the purpose of safe driving such as automatic stop, recognition of a driver's state, and the like An electronic device that is provided for home appliance such as a TV, a refrigerator, or an air conditioner to image a user's gesture and to operate a device according to the gesture An electronic device that is provided for medical purpose or health care such as an endoscope, an electronic microscope, or a device that images a blood vessel by receiving infrared light An electronic device that is provided for security such as a monitoring camera for crime prevention or a camera for authenticating a person An electronic device that is provided for beauty treatment such as a skin meter that images the skin and a microscope that images the scalp An electronic device that is provided for sports such as a dedicated action camera for sports or the like or a wearable camera An electronic device that is provided for agriculture such as a camera for monitoring states of farms or crops <Application to Moving Object>

The technology according to the present disclosure (the present technology) can be applied to various products. For example, the technology according to the present disclosure may be implemented as a device which is mounted in any kind of moving object such as a vehicle, an electric vehicle, a hybrid electric vehicle, a motor bike, a bicycle, a personal mobility, an airplane, a drone, a ship, and a robot.

Figure 24:
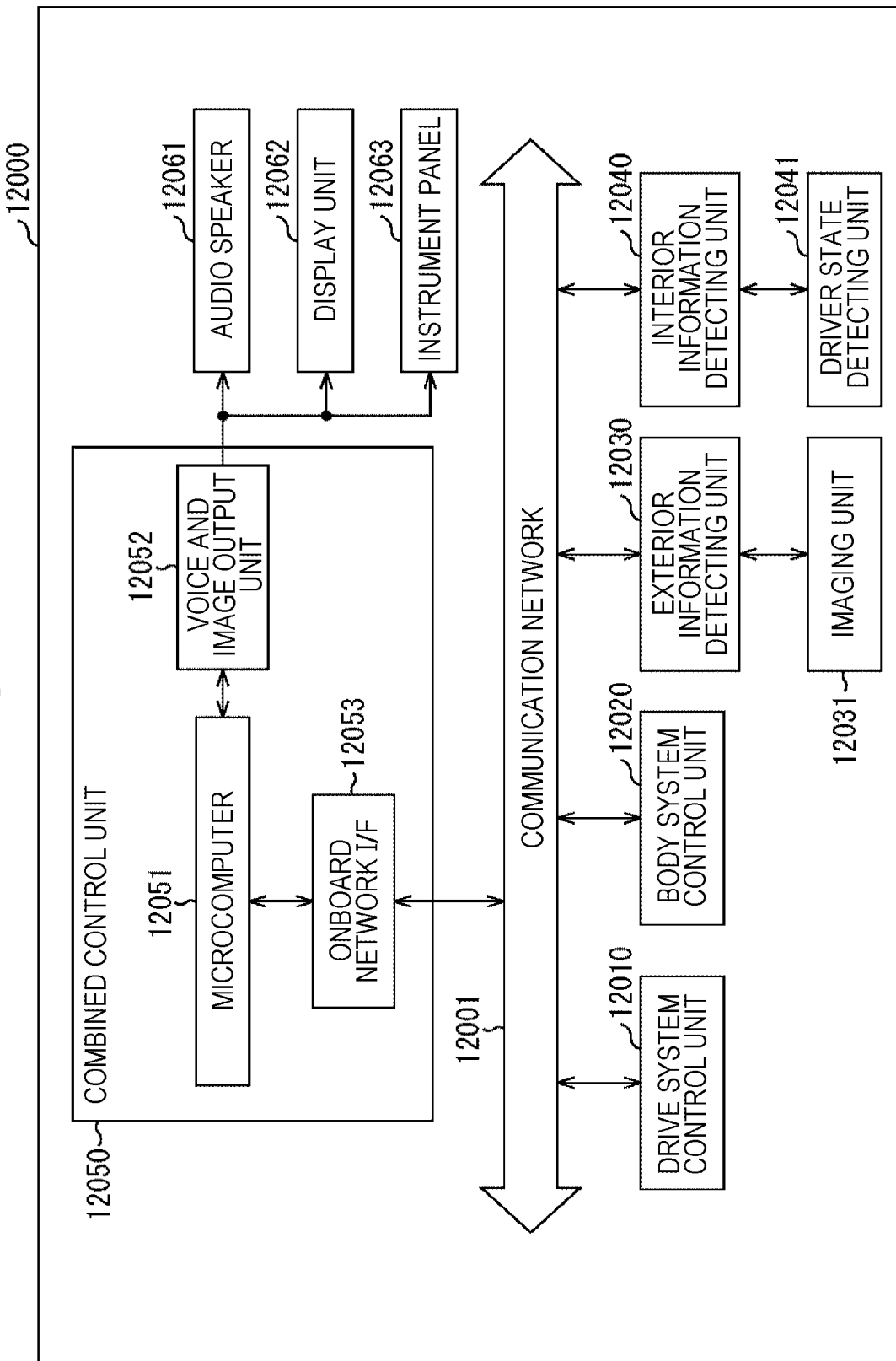
FIG. 24 is a block diagram schematically illustrating an example of a configuration of a vehicle control system.

FIG. 24 is a block diagram schematically illustrating an example of a configuration of a vehicle control system as an example of a moving object control system to which the technology according to the present disclosure can be applied.

A vehicle control system 12000 includes a plurality of electronic control units which are connected via a communication network 12001. In the example illustrated in FIG. 24, the vehicle control system 12000 includes a drive system control unit 12010, a body system control unit 12020, an exterior information detecting unit 12030, an interior information detecting unit 12040, and a combined control unit 12050. Further, as functional elements of the combined control unit 12050, a microcomputer 12051, a voice and image output unit 12052, and an onboard network interface (I/F) 12053 are illustrated.

The drive system control unit 12010 controls operations of devices associated with a drive system of a vehicle in accordance with various programs. For example, the drive system control unit 12010 functions as a controller for a driving force generating device that generates a driving force for the vehicle such as an internal combustion engine or a drive motor, a driving force transmission mechanism that transmits a driving force to vehicle wheels, a steering mechanism that adjusts a steering angle of the vehicle, a brake device that generates a braking force for the vehicle, and the like.

The body system control unit 12020 controls operations of various devices which are mounted in a vehicle body in accordance with various programs. For example, the body system control unit 12020 functions as a controller for a keyless entry system, a smart key system, a power window device, and various lamps such as a head lamp, a back lamp, a brake lamp, a winker, or a fog lamp. In this case, radio waves emitted from a portable unit in place of a key or signals from various switches can be input to the body system control unit 12020. The body system control unit 12020 receives inputting of such radio waves or signals and controls a door lock device, a power window device, lamps, and the like of the vehicle.

The exterior information detecting unit 12030 detects information the exterior of the vehicle in which the vehicle control system 12000 is mounted. For example, an imaging unit 12031 is connected to the exterior information detecting unit 12030. The exterior information detecting unit 12030 causes the imaging unit 12031 to capture an image outside the vehicle and receives the captured image. The exterior information detecting unit 12030 may perform an object detecting process or a distance detecting process for a person, a vehicle, an obstacle, a sign, characters, or the like on a road surface on the basis of the received image.

The imaging unit 12031 is an optical sensor that receives light and outputs an electrical signal corresponding to the light intensity of the received light. The imaging unit 12031 may output the electrical signal as an image or may output the electrical signal as distance measurement information. Further, light received by the imaging unit 12031 may be visible light or may be invisible light such as infrared light.

The interior information detecting unit 12040 detects interior information of the vehicle. For example, a driver state detecting unit 12041 that detects a driver's state is connected to the interior information detecting unit 12040. The driver state detecting unit 12041 includes, for example, a camera that images a driver, and the interior information detecting unit 12040 may calculate a degree of fatigue or a degree of concentration of the driver or may determine whether the driver is drowsy on the basis of the detection information input from the driver state detecting unit 12041.

The microcomputer 12051 can calculate a control target value of the driving force generating device, the steering mechanism, or the braking device on the basis of the exterior or interior information of the vehicle acquired by the exterior information detecting unit 12030 or the interior information detecting unit 12040 and can output a control command to the drive system control unit 12010. For example, the microcomputer 12051 can perform cooperative control for implementing a function of an advanced driver assistance system (ADAS) including collision avoidance or shock mitigation of a vehicle, following traveling based on an inter-vehicle distance, constant-speed traveling, collision warning of a vehicle or lane departure warning of a vehicle, and the like.

Further, the microcomputer 12051 can perform cooperative control for automatic driving or the like allowing a vehicle to travel autonomously without depending on a driver's operation by controlling the driving force generating device, the steering mechanism, the braking device, or the like on the basis of information around the vehicle which is acquired by the exterior information detecting unit 12030 or the interior information detecting unit 12040.

Further, the microcomputer 12051 can output a control command to the body system control unit 12020 on the basis of the exterior information acquired by the exterior information detecting unit 12030. For example, the microcomputer 12051 can perform cooperative control for achieving an antiglare function by controlling the headlamp depending on a position of a preceding vehicle or an oncoming vehicle detected by the exterior information detecting unit 12030 and switching a high beam to a low beam.

The voice and image output unit 12052 transmits at least one output signal of a voice and an image to an output device that can visually or auditorily notify an occupant of a vehicle or the vehicle exterior of information. In the example illustrated in FIG. 24, an audio speaker 12061, a display unit 12062, and an instrument panel 12063 are illustrated as the output device. The display unit 12062 may include, for example, at least one of an onboard display or head-up display.

Figure 25:
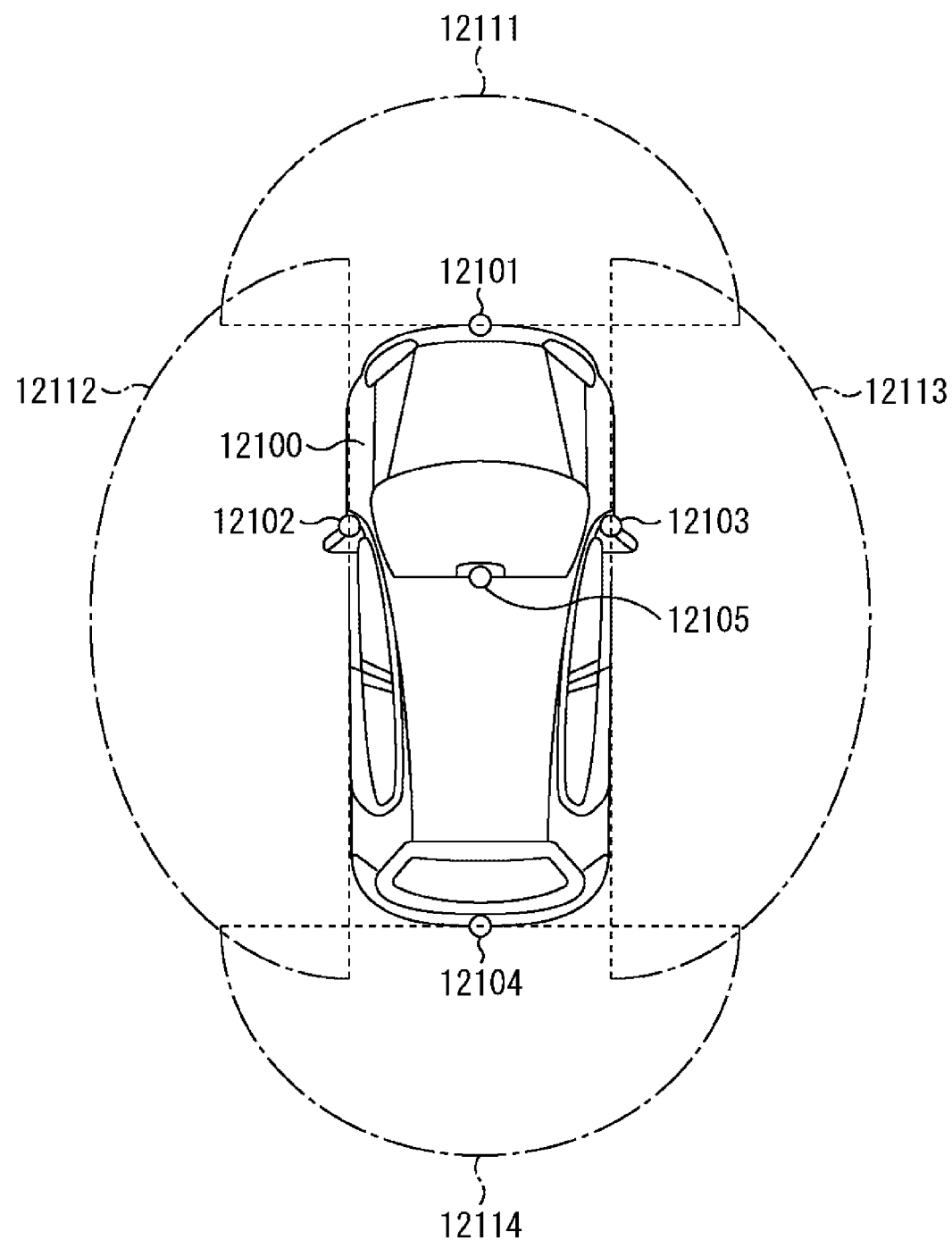
FIG. 25 is a diagram illustrating an example of an installation position of an imaging unit.

FIG. 25 is a diagram illustrating an example of an installation position of the imaging unit 12031.

In FIG. 25, a vehicle 12100 includes imaging units 12101, 12102, 12103, 12104, and 12105 as the imaging unit 12031.

The imaging units 12101, 12102, 12103, 12104, and 12105 are installed at positions such as a front nose, a side-view mirror, a rear bumper, a backdoor, and an upper part of a front windshield of the interior of the vehicle 12100. The imaging unit 12101 provided in the front nose and the imaging unit 12105 provided in the upper part of the front windshield of the interior of the vehicle mainly acquire an image of the front of the vehicle 12100. The imaging units 12102 and 12103 provided in the side-view mirror mainly acquire an image of the sides of the vehicle 12100. The imaging unit 12104 provided in the rear bumper or the backdoor mainly acquires an image of the rear of the vehicle 12100. The images of the front acquired by the imaging units 12101 and 12105 are mainly used to detect a preceding vehicle, a pedestrian, an obstacle, a traffic sign, a traffic marking, a lane, or the like.

Incidentally, an example of imaging ranges of each of the imaging units 12101 to 12104 is illustrated in FIG. 25. The imaging range 12111 indicates imaging ranges of the imaging unit 12101 provided in the front nose, the imaging ranges 12112 and 12113 indicates imaging ranges of the imaging units 12102 and 12103 provided in the side-view mirrors, and the imaging range 12114 indicates an imaging range of the imaging unit 12104 provided in the rear bumper or the backdoor. For example, by superimposing image data captured by the imaging units 12101 to 12104, an overhead image showing the vehicle 12100 from the overhead is acquired.

At least one of the imaging units 12101 to 12104 may have a function of acquiring distance information. For example, at least one of the imaging units 12101 to 12104 may be a stereoscopic camera including a plurality of imaging elements or may be an imaging element having pixels for detecting a phase difference.

For example, the microcomputer 12051 can extract a three-dimensional object, which is the closest on the traveling path of the vehicle 12100 and moves at a predetermined speed (for example, 0 km/h or more) substantially in the same direction as the vehicle 12100, as a preceding vehicle by calculating distances to three-dimensional objects within the imaging ranges 12111 to 12114 and change of the distances over time (speeds relative to the vehicle 12100) on the basis of the distance information acquired from the imaging units 12101 to 12104. In addition, the microcomputer 12051 can set an inter-vehicle distance which should be secured with respect to the preceding vehicle and perform automatic brake control (including following stop control), automatic acceleration control (including following start control), or the like. In this way, cooperative control for automatic driving or the like in which the vehicle travels autonomously without depending on a driver's operation can be performed.

For example, the microcomputer 12051 can sort and extract three-dimensional object data of three-dimensional objects into three-dimensional objects such as a two-wheeled vehicle, a general vehicle, a large vehicle, a pedestrian, a utility pole, or the like on the basis of the distance information acquired from the imaging units 12101 to 12104 and can use the data for automatic avoidance of an obstacle. For example, the microcomputer 12051 sorts obstacles near the vehicle 12100 into an obstacle which can be seen by a driver of the vehicle 12100 and an obstacle which cannot be seen by the driver. Then, the microcomputer 12051 can determine a collision risk indicating a risk level of collision with each obstacle, and perform driving support for collision avoidance by outputting a warning to the driver via the audio speaker 12061 or the display unit 12062 or forcibly decelerating or performing avoidance steering via the drive system control unit 12010 when there is a likelihood of collision because the collision risk is equal to or higher than a set value.

At least one of the imaging units 12101 to 12104 may bean infrared camera that detects infrared light. For example, the microcomputer 12051 can recognize a pedestrian by determining whether or not a pedestrian is present in the captured images from the imaging units 12101 to 12104. Such recognition of a pedestrian can be performed, for example, by a routine of extracting feature points in the captured images from the imaging units 12101 to 12104 as an infrared camera and a routine of performing a pattern matching process on a series of feature points indicating an outline of an object and determining whether or not the object is a pedestrian. When the microcomputer 12051 determines that a pedestrian is present in the captured images from the imaging units 12101 to 12104 and recognizes a pedestrian, the voice and image output unit 12052 controls the display unit 12062 such that a rectangular frame line for emphasis is displayed to overlap the recognized pedestrian. Further, the voice and image output unit 12052 may control the display unit 12062 such that an icon or the like indicating a pedestrian is displayed at a desired position.

An example of a vehicle control system to which the technology according to the present disclosure can be applied has been described above. The technology according to the present disclosure can be applied, for example, the imaging unit 12031 in the above-mentioned configuration. Specifically, the imaging device 2 illustrated in FIG. 2 can be applied to the imaging unit 12031. By applying the technology according to the present disclosure to the imaging unit 12031, the imaging unit 12031 can output information which is required by a user, that is, information which is required by blocks performing processing in a subsequent stage (hereinafter also referred to as a subsequent-stage block). Accordingly, the subsequent-stage block does not need to perform a process of generating necessary information from an image and it is thus possible to reduce a load of the subsequent-stage block by as much.

Here, in this specification, the processes which are performed by a computer (processor) in accordance with a program do not need to be performed in time series in the order described as the flowcharts. That is, the processes which are performed by the computer in accordance with a program include processes which are performed in parallel or individually (for example, parallel processes or processes using objects).

Further, the program may be processed by one computer (processor) or may be distributed to and processed by a plurality of computers.

Incidentally, an embodiment of the present technology is not limited to the above-mentioned embodiments and can be modified in various forms without departing from the gist of the present technology.

For example, the present technology can be applied to an image sensor that senses radio waves such as infrared light other than visible light in addition to an image sensor that senses visible light.

Further, the effects described in this specification are only examples and are not restrictive. Another effect may be achieved.

Incidentally, the present technology can have the following configurations.

<1>
A single-chip imaging device including:
an imaging unit in which a plurality of pixels is arranged two-dimensionally and that captures an image;
a signal processing unit that performs signal processing using a captured image output from the imaging unit;
an output I/F that outputs a signal processing result of the signal processing and the captured image to an outside; and
an output control unit that performs output control of selectively outputting the signal processing result of the signal processing and the captured image from the output I/F to the outside.
<2>
The imaging device according to <1>, in which the imaging device has a stacked structure in which a plurality of dies is stacked.
<3>
The imaging device according to <1> or <2>, further including an image compressing unit that compresses the captured image and generates a compressed image having a smaller amount of data than that of the captured image.
<4>
The imaging device according to any of <1> to <3>, further including:
an imaging control unit that includes a register storing imaging information associated with capturing of the captured image and controls capturing of the captured image according to the imaging information; and
an imaging information calculating unit that calculates the imaging information using the signal processing result,
in which the imaging control unit and the imaging information calculating unit are connected to each other via a predetermined connection line, and
the imaging information calculating unit feeds back the imaging information to the register of the imaging control unit via the predetermined connection line.
<5>
The imaging device according to <4>, in which the register stores output control information associated with the output control, and
the output control unit performs the output control according to the output control information stored in the register.
<6>
The imaging device according to <4> or <5>, further including a first communication I/F that exchanges information to be read from and written to the register with the outside.
<7>
The imaging device according to any of <1> to <6>, in which the signal processing unit is a processor that executes a program, and
the imaging device further includes a second communication I/F that downloads the program which is executed by the processor from the outside.
<8>
The imaging device according to any of <1> to <7>, in which the signal processing unit performs a recognition process of recognizing a predetermined recognition object from the captured image as the signal processing.
<9>
The imaging device according to any of <1> to <7>, further including an input I/F that receives an external sensor output from an external sensor,
in which the signal processing unit performs signal processing using the captured image and the external sensor output.
<10>
The imaging device according to <9>, in which the external sensor output is an output of a range sensor that senses information associated with a distance or an output of an image sensor that senses light and outputs an image corresponding to the light.
<11>
The imaging device according to <10>, in which the signal processing unit performs a fusion process of calculating a distance using the captured image and the output of the range sensor or a self-localization process using an image as the output of the image sensor and the captured image as the signal processing.
<12>
An electronic device including:
an optical system that collects light; and
a single-chip imaging device that receives light and outputs an image corresponding to a received light intensity of the light,
in which the imaging device includes
an imaging unit in which a plurality of pixels is arranged two-dimensionally and that captures an image,
a signal processing unit that performs signal processing using a captured image output from the imaging unit,
an output I/F that outputs a signal processing result of the signal processing and the captured image to an outside, and
an output control unit that performs output control of selectively outputting the signal processing result of the signal processing and the captured image from the output I/F to the outside.

REFERENCE SIGNS LIST

1 Optical system
2 Imaging device
3 Memory
4 Signal processing unit

5 Output unit
6 Control unit
20 Imaging block
21 Imaging unit
22 Imaging processing unit
23 Output control unit
24 Output I/F
25 Imaging control unit
26 Communication I/F
27 Register group
30 Signal processing block
31 CPU
32 DSP
33 Memory
34 Communication I/F
35 Image compressing unit
36 Input I/F
51, 52 Die
71 Rectification unit

What is claimed is:

1. An imaging device, comprising:
an imaging unit in which a plurality of pixels is arranged two-dimensionally and that captures an image;
a recognition processor that performs at least part of a recognition process for a first captured image output from the imaging unit;
an output I/F that outputs both a recognition result by the recognition processor or intermediate data acquired midway of the recognition process and a second captured image to an outside of the imaging device; and
an output control processor that causes at least one of the recognition result or the intermediate data and the captured image to be selectively outputted from the output I/F to the outside of the image device,
wherein the imaging unit and the recognition processor are arranged on a single chip.

2. The imaging device according to claim 1, wherein the imaging device has a stacked structure in which a plurality of dies is stacked.

3. The imaging device according to claim 1, further comprising an image compressing unit that compresses the captured image and generates a compressed image having a smaller amount of data than that of the captured image.

4. The imaging device according to claim 1, further comprising:
an imaging control processor that includes a register storing imaging information associated with capturing of the captured image and controls capturing of the captured image according to the imaging information; and
an imaging information calculating processor that calculates the imaging information using the recognition result,
wherein the imaging control processor and the imaging information calculating processor are connected to each other via a predetermined connection line, and
the imaging information calculating processor feeds back the imaging information to the register of the imaging control processor via the predetermined connection line.

5. The imaging device according to claim 4, further comprising a first communication I/F that exchanges information to be read from and written to the register with the outside of the imaging device.

6. The imaging device according to claim 1, wherein the recognition processor executes a program, and the imaging device further comprises a second communication I/F that downloads the program which is executed by the recognition processor from the outside of the imaging device.

7. The imaging device according to claim 1, further comprising an input I/F that receives an external sensor output from an external sensor,
wherein the recognition processor performs recognition processing using the captured image and the external sensor output.

8. The imaging device according to claim 7, wherein the external sensor output is an output of a range sensor that senses information associated with a distance or an output of an image sensor that senses light and outputs an image corresponding to the light.

9. The imaging device according to claim 8, wherein the recognition processor performs a fusion process of calculating a distance using the captured image and the output of the range sensor or a self-localization process using an image as the output of the image sensor and the captured image as the recognition processing.

10. An electronic device comprising:
an optical system that collects light; and
a single-chip imaging device that receives light and outputs an image corresponding to a received light intensity of the light,
wherein the imaging device includes:
an imaging unit in which a plurality of pixels is arranged two-dimensionally and that captures an image;
a recognition processors that performs at least part of a recognition process for a first captured image output from the imaging unit;
an output I/F that outputs both a recognition result by the recognition processor or intermediate data acquired midway of the recognition process and a second captured image to an outside of the imaging device; and
an output control processor that cause at least one of the recognition result or the intermediate data and the captured image to be selectively outputted from the output I/F to the outside of the image device,
wherein the imaging unit and the recognition processor are arranged on a single chip.

11. The imaging device according to claim 1,
wherein the single chip includes a first substrate and a second substrate joint together,
wherein the first substrate includes the imaging unit, and
wherein the second substrate includes the recognition processor.

12. The imaging device according to claim 1,
wherein the captured image is an image generated by compressing the output of the imaging unit, and
wherein the recognition processor performs at least part of the recognition process for the captured image generated by the compression.

13. The imaging device according to claim 1, wherein the captured image is an image generated by performing a gradation process for the output of the imaging unit.

14. The imaging device according to claim 1, further comprising:
an imaging processor that processes the captured image outputted from the imaging unit; and
a control processor that controls processing by the imaging processor or an imaging operation to be executed by the imaging unit, according to the result of the recognition process.

15. The imaging device according to claim 14, wherein the control processor causes the imaging processor to execute a process of cutting out a part associated with an area specified by the recognition process from the captured image.

16. The imaging device according to claim 14, wherein the control processor controls the imaging operation by the imaging unit such that a part associated with an area specified by the recognition process is read out.

17. The imaging device according to claim 14, wherein the control processor controls at least one of an exposure time, a focus, a frame rate, and an imaging mode in the imaging operation by the imaging unit.

18. The imaging device according to claim 1, wherein the recognition processors performs the recognition process using a technique of deep learning.

19. The imaging device according to claim 18, wherein the technique of deep learning is a convolutional neural network.

20. The imaging device according to claim 1, wherein the recognition processor executes the recognition process after acquisition of the captured image based on the output of the imaging unit being completed in each frame.

21. The imaging device according to claim 1, wherein the recognition processor starts the recognition process before acquisition of the captured image based on the output of the imaging unit being completed in each frame.

\* \* \* \* \*